US012811095B2

(12) United States Patent
Wieland

(10) Patent No.: US 12,811,095 B2
(45) Date of Patent: Nov. 24, 2026

(54) CHARGED-PARTICLE MULTI-BEAM COLUMN, CHARGED-PARTICLE MULTI-BEAM COLUMN ARRAY, INSPECTION METHOD

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 705 days.

(21) Appl. No.: 18/150,745

(22) Filed: Jan. 5, 2023

(65) Prior Publication Data

US 2023/0238215 A1 Jul. 27, 2023

Related U.S. Application Data

(63) Continuation of application No. PCT/EP2021/067701, filed on Jun. 28, 2021.

(30) Foreign Application Priority Data

Jul. 6, 2020 (EP) .................................... 20184161

(51) Int. Cl.
*H01J 37/317* (2006.01)
*H01J 37/12* (2006.01)
(Continued)

(52) U.S. Cl.
CPC .......... *H01J 37/3177* (2013.01); *H01J 37/12* (2013.01); *H01J 37/153* (2013.01); *H01J 37/244* (2013.01);
(Continued)

(58) Field of Classification Search
CPC ...... H01J 37/3177; H01J 37/12; H01J 37/153; H01J 37/244; H01J 37/28; H01J 2237/0453; H01J 2237/1534
See application file for complete search history.

(56) References Cited

U.S. PATENT DOCUMENTS 5,012,105 A 4/1991 Ando et al.
9,922,796 B1 3/2018 Frosien et al.
(Continued)

FOREIGN PATENT DOCUMENTS

CN 103650097 A 3/2014
EP 1619495 A1 1/2006
(Continued)

OTHER PUBLICATIONS

International Search Report issued in related Foreign Application No. PCT/EP2021/067701; mailed Oct. 22, 2021 (4 pgs.).
(Continued)

*Primary Examiner* — Georgia Y Epps
*Assistant Examiner* — Hanway Chang
(74) *Attorney, Agent, or Firm* — Finnegan, Henderson, Farabow, Garrett & Dunner LLP

(57) ABSTRACT

The disclosure relates to charged-particle multi-beam columns and multi-beam column arrays. In one arrangement, a sub-beam defining aperture array forms sub-beams from a beam of charged particles. A collimator array collimates the sub-beams. An objective lens array projects the collimated sub-beams onto a sample. A detector detects charged particles emitted from the sample. Each collimator is directly adjacent to one of the objective lenses. The detector is provided in a plane down-beam from the sub-beam defining aperture array.

21 Claims, 14 Drawing Sheets

(51) Int. Cl.
*H01J 37/153* (2006.01)
*H01J 37/244* (2006.01)
*H01J 37/28* (2006.01)

(52) U.S. Cl.
CPC ....... *H01J 37/28* (2013.01); *H01J 2237/0453* (2013.01); *H01J 2237/1534* (2013.01)

(56) References Cited

U.S. PATENT DOCUMENTS

| | | | | |
|---|---|---|---|---|
| 10,453,645 | B2 * | 10/2019 | Frosien | H01J 37/153 |
| 2005/0269528 | A1 | 12/2005 | Kruit | |
| 2009/0212229 | A1 | 8/2009 | Wieland et al. | |
| 2010/0320382 | A1 | 12/2010 | Almogy et al. | |
| 2014/0166894 | A1 | 6/2014 | Kato et al. | |
| 2016/0062249 | A1 * | 3/2016 | Yamada | G03F 7/70425 355/72 |
| 2020/0051779 | A1 | 2/2020 | Ren et al. | |
| 2022/0392745 | A1 * | 12/2022 | Wieland | H01J 37/12 |
| 2023/0245849 | A1 * | 8/2023 | Wieland | H01J 37/1474 250/306 |

FOREIGN PATENT DOCUMENTS

| | | | |
|---|---|---|---|
| EP | 2425444 | A1 | 3/2012 |
| EP | 2575143 | A1 | 4/2013 |
| EP | 2702595 | A1 | 3/2014 |
| EP | 2715768 | A2 | 4/2014 |
| EP | 2912442 | A1 | 9/2015 |
| EP | 2715768 | B1 | 1/2020 |
| EP | 2912442 | B1 | 5/2020 |
| JP | S60-39828 | | 3/1985 |
| JP | 2012195368 | A | 10/2012 |
| KR | 20070021262 | A | 2/2007 |
| KR | 20070085210 | A | 8/2007 |
| KR | 101330368 | B1 | 11/2013 |
| KR | 20190091318 | A | 8/2019 |
| WO | WO 2012/165955 | A2 | 12/2012 |
| WO | WO 2014/065663 | A1 | 5/2014 |
| WO | WO 2018/099756 | A1 | 6/2018 |

OTHER PUBLICATIONS

Sheng-Yung Chen, et al., “In situ beam drift detection using a two-dimensional electron-beam position monitoring system for multiple-electron-beam-direct-write lithography”, Journal of Vacuum Science & Technology B, vol. 29, No. 4, pp. 041607-1-041607-12, Jul./Aug. 2011; doi: 10.1116/1.3613697.

* cited by examiner

CHARGED-PARTICLE MULTI-BEAM COLUMN, CHARGED-PARTICLE MULTI-BEAM COLUMN ARRAY, INSPECTION METHOD

CROSS-REFERENCE TO RELATED APPLICATIONS

This application claims priority of International application PCT/EP2021/067701, which was filed on 28 Jun. 2021 and claims priority of EP Application Serial No. 20184161.6, which was filed on 6 Jul. 2020. These applications are incorporated herein by reference in their entireties.

FIELD

The embodiments provided herein relate generally to charged-particle multi-beam columns for use in charged-particle tools and inspection methods.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In an SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface it is possible to obtain an image representing characteristics of the material structure of the surface of the sample.

There is a general need to reduce complexity and/or improve the throughput and other characteristics of charged particle tools and inspection methods.

SUMMARY

Some of the objectives of the disclosed embodiments is to reduce complexity and/or improve throughput and/or other characteristics of charged particle tools and associated methods.

According to some embodiments of the present disclosure, there is provided a charged-particle multi-beam column for a charged-particle tool for projecting a charged-particle multi-beam towards a sample, the charged-particle multi-beam column comprising: a sub-beam defining aperture array configured to form sub-beams from a beam of charged particles emitted by a source; a collimator array down-beam from the sub-beam defining aperture array, each collimator being configured to collimate a sub-beam; an objective lens array, each objective lens being configured to project a collimated sub-beam onto a sample; and a detector configured to detect charged particles emitted from the sample, wherein each collimator is directly adjacent to one of the objective lenses; and the detector is provided in a plane down-beam from the sub-beam defining aperture array.

According to some embodiments of the present disclosure, there is provided a charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array being aligned with a corresponding objective lens in the objective lens array and configured to allow only a selected portion of the sub-beam incident onto the down-beam aperture array from the objective lens to pass through the aperture.

According to some embodiments of the present disclosure, there is provided a charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array having a corresponding objective lens in the objective lens array, wherein the apertures of the down-beam aperture array are of smaller cross-sectional area than the corresponding apertures defined in the sub-beam defining aperture array and/or the objective lens array.

According to some embodiments of the present disclosure, there is provided a charged-particle multi-beam column for a charged particle tool for projecting a charged-particle multi-beam towards a sample, the charged-particle multi-beam column comprising: an objective lens array, each objective lens being configured to project a sub-beam onto a sample; and a sub-beam defining aperture array adjacent and/or integrated into the objective lens array, the apertures of the sub-beam defining array and apertures of the objective lens array being along corresponding paths of the sub-beams wherein: the sub-beam defining aperture array is configured to allow only a selected portion of the sub-beam incident on each aperture of the sub-beam defining array through said aperture; and/or wherein: the apertures of the sub-beam defining aperture array are of smaller cross-sectional area than the corresponding apertures defined in the objective lens array.

According to some embodiments of the present disclosure, there is provided a charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a detector configured to detect charged particles emitted from the sample, wherein the detector is provided in a plane down-beam from the sub-beam defining aperture array and up-beam from the objective lens array.

According to some embodiments of the present disclosure, there is provided a charged-particle multi-beam column array for a charged-particle tool for projecting a plurality of charged-particle multi-beams towards a sample, the charged-particle multi-beam column array comprising: a plurality of charged-particle multi-beam columns configured to project respective multi-beams simultaneously onto different regions of the sample; and a focus corrector configured to apply a group focus correction to each of a plurality of groups of sub-beams of the multi-beams, each group focus correction being the same for all of the sub-beams of the respective group.

According to some embodiments of the present disclosure, there is provided an inspection method, comprising: using a multi-beam column array to project plural charged-particle multi-beams towards a sample; and applying a group focus correction to each of a plurality of groups of sub-beams of the multi-beams, each group focus correction being the same for all of the sub-beams of the respective group.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
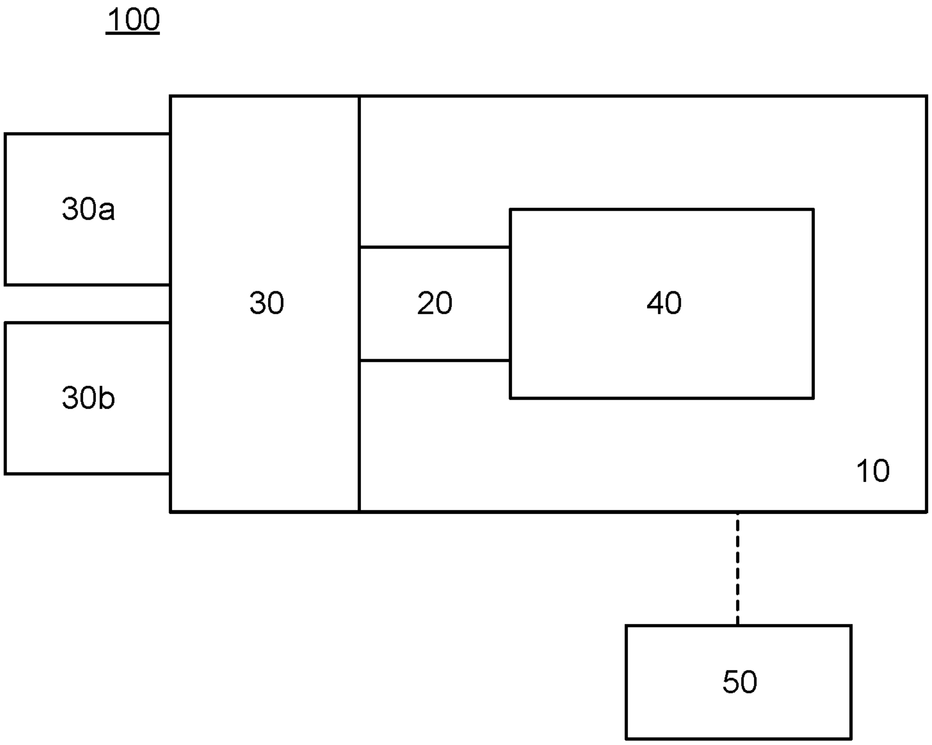
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

The following figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be considered as general references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, a charged particle beam tool 40 (which may be referred to as an electron beam tool where electrons are used as the charged particles), an equipment front end module (EFEM) 30 and a controller 50. Charged particle beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure around the sample reaches a second pressure lower than the first pressure. After reaching the second pressure, the sample is transported to the charged particle beam tool 40 by which it may be inspected. A charged particle beam tool 40 may comprise a multi-beam electron-optical apparatus.

Controller 50 is electronically connected to charged particle beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus 100 or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus that operate under the second pressure.

Figure 2:
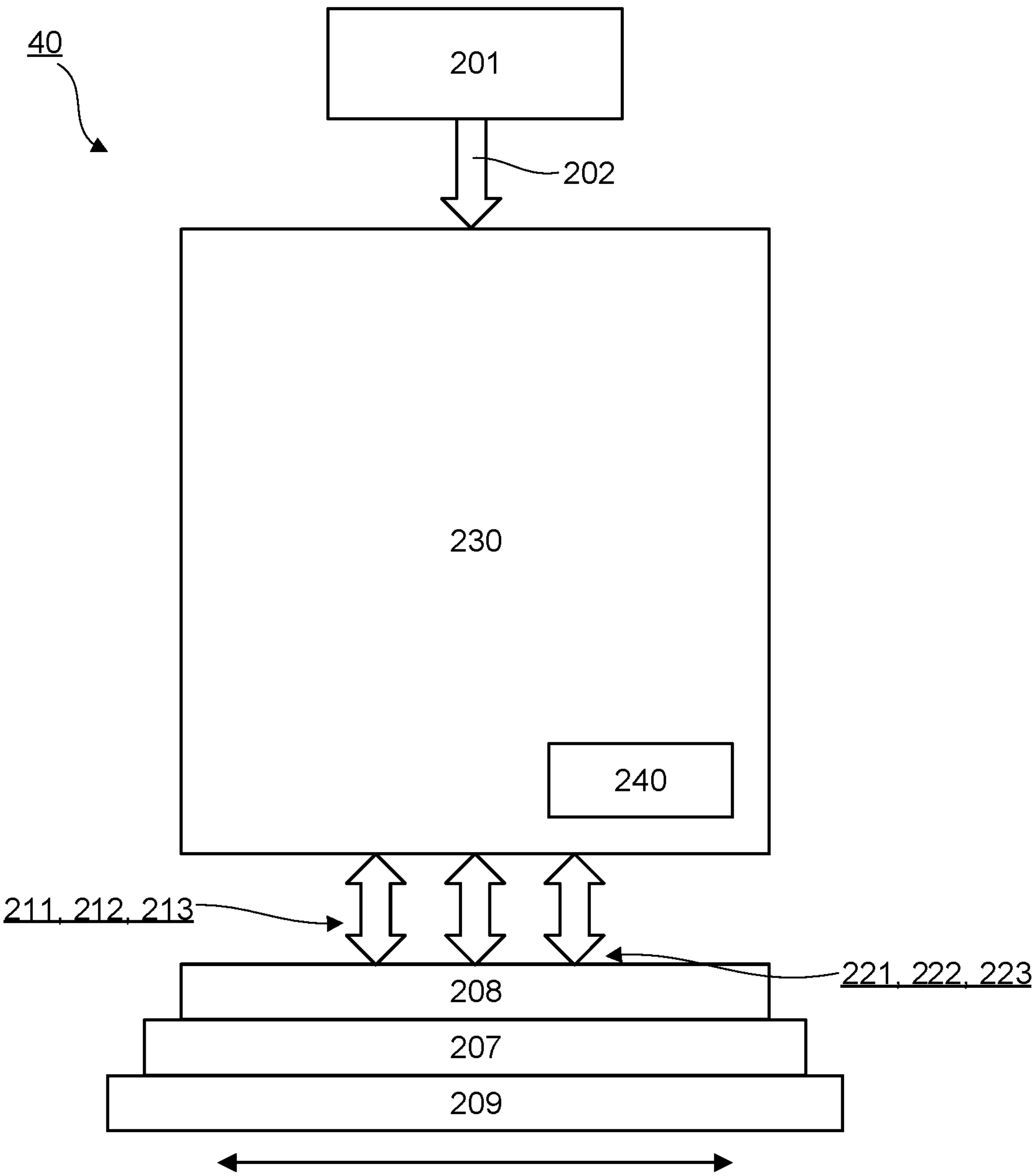
FIG. 2 is a schematic diagram illustrating an exemplary charged particle beam tool that is part of the exemplary charged particle beam inspection apparatus of FIG. 1.

Reference is now made to FIG. 2, which is a schematic diagram illustrating an exemplary charged particle beam tool 40 that is part of the exemplary charged particle beam inspection apparatus 100 of FIG. 1. The charged particle beam tool 40 (also referred to herein as apparatus 40) may comprise a charged particle source 201 (e.g. an electron source), a projection apparatus 230, a motorized stage 209, and a sample holder 207. The charged particle source 201 and projection apparatus 230 may together be referred to as an electron-optical apparatus. The sample holder 207 is supported by motorized stage 209 so as to hold a sample 208 (e.g., a substrate or a mask) for inspection. The charged particle beam tool 40 may further comprise an electron detection device 240.

The charged particle source 201 may comprise a cathode (not shown) and an extractor or anode (not shown). The charged particle source 201 may be configured to emit electrons as primary electrons from the cathode. The primary electrons are extracted or accelerated by the extractor and/or the anode to form a charged particle beam 202 comprising primary electrons.

Projection apparatus 230 is configured to convert charged particle beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 may be connected to various parts of charged particle beam inspection apparatus 100 of FIG. 1, such as charged particle source 201, electron detection device 240, projection apparatus 230, and motorized stage 209. Controller 50 may perform various image and signal processing functions. Controller 50 may also generate various control signals to govern operations of the charged particle beam inspection apparatus 100, including the charged particle beam tool 40.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons may be generated from the sample 208 which may include secondary electrons and backscattered electrons. The secondary electrons typically have electron energy ≤50 eV. The backscattered electrons typically have electron energy between 50 eV and the landing energy of primary sub-beams 211, 212, and 213.

Electron detection device 240 may be configured to detect secondary electrons and/or backscattered electrons and to generate corresponding signals which are sent to controller 50 or a signal processing system (not shown), e.g. to construct images of the corresponding scanned areas of sample 208. The electron detection device 240 may be incorporated into the projection apparatus 230 or may be separate therefrom, with a secondary optical column being provided to direct secondary electrons and/or backscattered electrons to the electron detection device 240.

The controller 50 may comprise an image processing system that includes an image acquirer (not shown) and a storage device (not shown). For example, the controller 50 may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the charged particle beam tool 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of detected charged particles (e.g. secondary electrons). The charged particle (e.g. electron) distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

Figure 3:
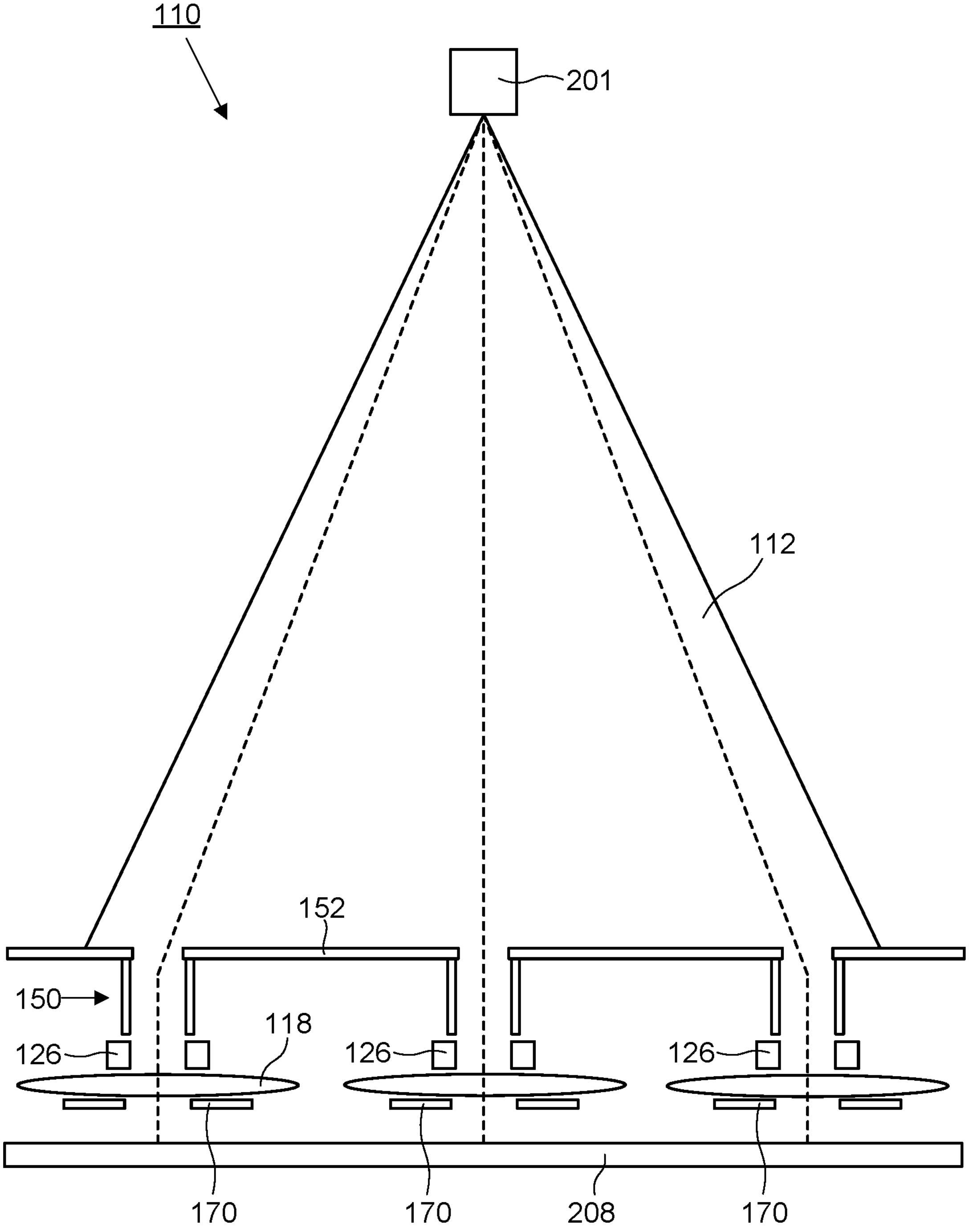
FIG. 3 is a schematic diagram of a charged-particle multi-beam column comprising a collimator array.

FIG. 3 depicts a charged-particle multi-beam column 110 according to some embodiments of the present disclosure. The charged-particle multi-beam column 110 may be provided as part of a charged-particle tool that projects a charged-particle multi-beam (e.g. comprising a plurality of sub-beams derived from a primary beam) towards a sample 208. The charged-particle tool may comprise any of the features of the charged particle beam tool 40 discussed above with reference to FIG. 2. The multi-beam column 110 receives a beam of charged particles from a charged particle beam source 201. The source 201 emits charged particles 112. In some embodiments, the charged particles comprise or consist of electrons. The source 201 may be configured in any of the ways described above with reference to FIG. 2, for example a single source. The source 201 may thus comprise a cathode (not shown) and an extractor or anode (not shown). The source 201 may comprise a high brightness thermal field emitter with a desirable balance between brightness and total emission current. In an arrangement there may be a plurality of sources. The source 210 may be one source in the plurality of sources. The plurality of sources may form an array of sources and be referred to as a source array. In the source array, the sources may be provided on a common substrate.

The multi-beam column 110 comprises a sub-beam defining aperture array 152 (e.g. comprising a plate-like body having a plurality of apertures). The sub-beam defining aperture array 152 forms sub-beams from a beam of charged particles emitted by the source 201. The multi-beam column 110 further comprises a collimator array 150. The collimator array 150 comprises a plurality of collimators. Three collimators are shown in FIG. 3. The collimator array 150 is down-beam from the sub-beam defining aperture array 152. The collimators are each configured to collimate a sub-beam. The collimator array 150 forms collimated sub-beams from the emitted charged particles 112.

The sub-beam defining aperture array 152 may be directly adjacent to the collimator array 150 and/or integrated with the collimator array 150. Each of the collimators in the collimator array 150 may be deflectors and may referred to as collimator deflectors.

The multi-beam array 110 further comprises an objective lens array 118 comprising a plurality of objective lenses. Three objective lenses are shown in FIG. 3. The path of charged particles is schematically depicted by broken lines in FIG. 3 and it can be seen schematically that the collimators deflect the charged particles so that the sub-beams are incident substantially normally onto the objective lenses and, thereafter, onto the sample 208. The objective lenses of the objective lens array 118 may be in a common plane. Each objective lens projects a collimated sub-beam onto the sample 208. The distance from the source 201 to each objective lens is selected to provide a desired demagnification. The collimation of the sub-beams may reduce field curvature effects at the objective lenses, thereby reducing errors caused by field curvature, such as astigmatism and focus error. The collimator array 150 is not provided in an intermediate image plane relative to an array of condenser lenses in the present example. This could increase chromatic aberration and thereby increase a minimum size of illuminated spot on the sample 208. The area illuminated by each single source 201 may, however, be relatively small so that any increase to the minimum size of illuminated spot due to chromatic aberration may be tolerable.

Objective lens arrays are depicted schematically herein by arrays of oval shapes. Each oval shape represents one of the objective lenses in the objective lens array. The oval shape is used by convention to represent a lens, by analogy to the biconvex form often adopted in optical lenses. In the context of charged-particle arrangements such as those discussed herein, it will be understood however that objective lens arrays will typically operate electrostatically and so may not require any physical elements adopting a biconvex shape. The objective lens array may for example comprise at least two plates each with a plurality of holes or apertures. The position of each hole in a plate corresponds to the position of a corresponding hole in another plate. The corresponding holes operate in use on the same beam or sub-beam in the multi-beam.

The multi-beam column 110 further comprises a detector 170. The detector 170 detects charged particles (e.g. secondary electrons and/or backscattered electrons) emitted from the sample 208. The detector 170 is provided in a plane down-beam from the sub-beam defining aperture array 152. In some embodiments, as exemplified in FIG. 3, the detector 170 is located in a down-beam-most surface of the multi-beam column 110 (e.g. facing the sample 208 in use). In other embodiments, as exemplified in FIGS. 18 and 19 and discussed below, the detector is located in a plane up-beam from the objective lens array 118 or up-beam of at least one electrode of the objective lens array 118. In the example discussed, the detector 170 is located in a down-beam surface of the sub-beam defining aperture array 152.

In some embodiments of the present disclosure, the detector 170, for example comprises a CMOS chip detector, is integrated with a bottom electrode of one or more of the objective lenses of the objective lens array 118. The detector 170 may be configured in any of the ways described above for the electron detection device 240. The detector 170 may for example generate signals that are sent to a controller 50 or a signal processing system as described above with reference to FIGS. 1 and 2, e.g. to construct images of areas of the sample 208 scanned over by the multi-beam column 110 or perform other post-processing.

In the example shown, each collimator in the collimator array 150 is up-beam of for example spaced apart at least by a small distance, preferably adjacent, for example directly adjacent to, one of the objective lenses in the objective lens array 118. The collimator may be in direct contact with the objective lens or spaced apart from the objective lens by a small distance (with or without any other element being provided in between). By being directly adjacent to, or at least proximately close to, an objective lens, the collimator and the sub-beam defining aperture array 152 (which may be the first array element along a beam path from the source 201) can be much closer to the sample 208 than in alternative arrangements in which a collimator array is provided further up-beam, for example in an intermediate image plane associated with a condenser lens array. The collimator array 150 and sub-beam defining aperture array 152 are thus closer to the objective lenses and/or sample 208 than to the source 201. A distance between the sub-beam defining aperture array 152 and the objective lenses is desirably much smaller than a distance from the source 201 to the sub-beam defining aperture array 152, preferably about 10 times smaller.

Providing the collimator array 150 close to the sample 208 in this manner simplifies the requirements for charged particle optics up-beam of the collimator array 150. The need for correctors to ensure that sub-beams enter the collimators and/or objective lenses with good alignment is less stringent for example (because the sub-beams are formed directly up-beam of the collimators and/or objective lenses, so are intrinsically well aligned).

In some embodiments, as exemplified in FIG. 3, the multi-beam column 110 is configured so that the charged particles propagate from the source 201 to the sub-beam defining aperture array 152 without passing through any lens array or deflector array. The lens array may be a plurality of lenses in a single plane. The deflector array may be a plurality of deflectors in a single plane. The region up-beam of the collimator array is thus free from any lens array or deflector array. No lens array or deflector array is present up-beam of the collimator array 150 (e.g. between the source 201 and the collimator array 150). The collimator array 150 is the first electron-optical array element in the beam path down-beam of an illumination system, preferably the source 201, configured to emit the charged particle beam. Avoiding any lens or deflector array element up-beam of the collimator array 150 may mean that a smaller proportion of the charged particles from the source 201 are guided through the objective lenses but the requirements for charged particle optics up-beam of the objective lenses, and for correctors to correct for imperfections in such optics, are reduced. For example, some alternative arrangements seek to maximize source current utilization by providing two lens arrays (a condenser lens array in addition to an objective lens array). The provision of two lens arrays in this manner results in stringent requirements on position of the virtual source position uniformity over the source opening angle, or require corrective optics per sub-beam in order to make sure each sub-beam passes through the center of its corresponding objective lens down-beam. A design philosophy of embodiments of the present disclosure is to minimize the beam path from a first array element in the beam path from the source 201 to the sample 208 (e.g. a plurality of apertures, lenses or deflectors in a single plane configured to create and/or interact with a corresponding plurality of sub-beams, such as the sub-beam defining aperture array 152 or collimator array 150 in the specific examples discussed above) to a last element in the beam path from the source 201 (e.g. a bottom electrode of an objective lens or a detector 170). Architectures described herein allow this beam path to be reduced considerably. In some arrangements, the beam path can be reduced to less than about 10 mm, preferably to less than about 5 mm, preferably to less than about 2 mm. Reducing the beam path reduces or removes the stringent requirements on virtual source position over the source opening angle. Source current utilization may be lower than alternative arrangements using two lens arrays, but this can be compensated for by providing a multi-beam column array (comprising a plurality of the multi-beam columns 110), as described below.

Figure 4:
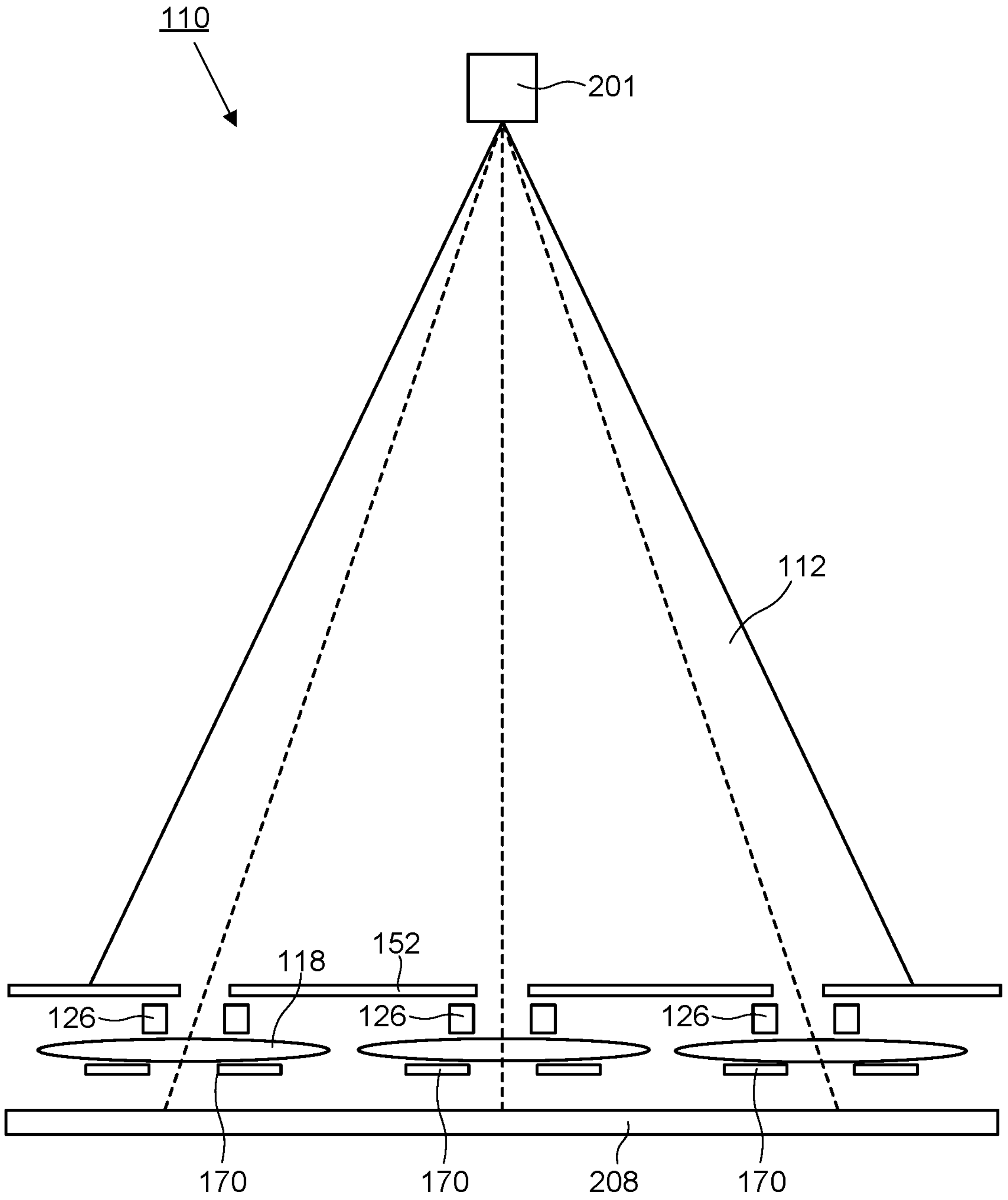
FIG. 4 is a schematic diagram of a charged-particle multi-beam column without a collimator array.
Figure 5:
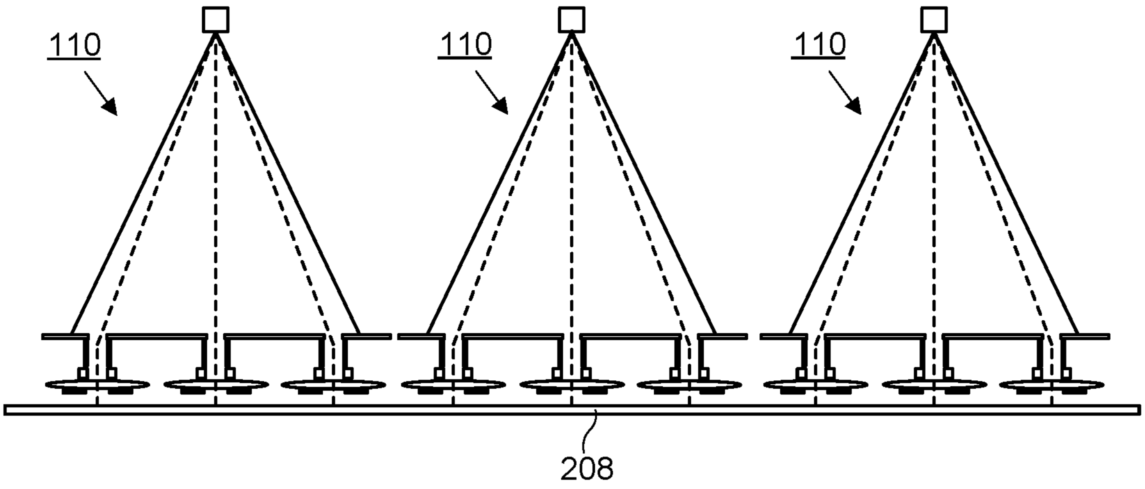
FIG. 5 is a schematic diagram of a charged-particle multi-beam column array comprising the multi-beam columns of FIG. 3.
Figure 6:
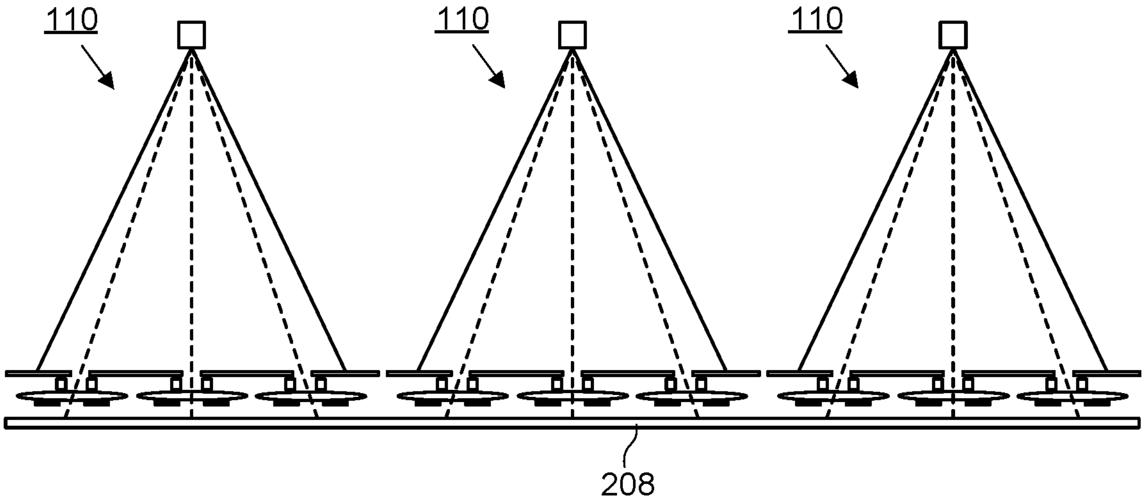
FIG. 6 is a schematic diagram of a charged-particle multi-beam column array comprising the multi-beam columns of FIG. 4.

FIG. 4 depicts a variation on the example of FIG. 3 in which the collimator array 150 is omitted. The example of FIG. 4 may otherwise be configured in any of the ways described above for the example of FIG. 3. Omitting the collimator array 150 simplifies the overall arrangement and may allow the sub-beam defining aperture array 152 to be positioned closer to, and/or integrated with, the objective lens array.

Figure 7:
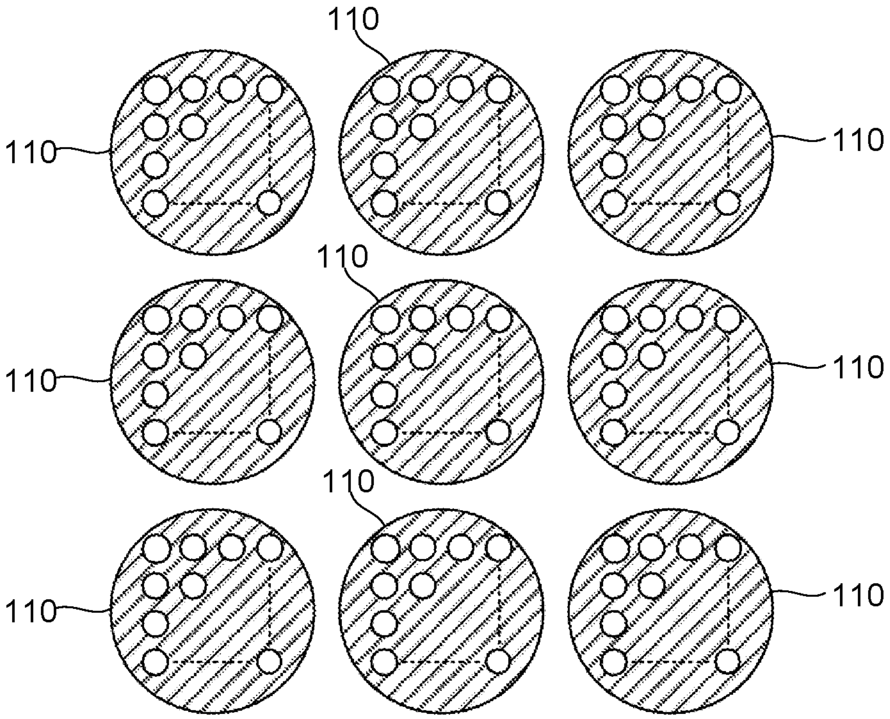
FIG. 7 is a schematic plan view of a rectangular multi-beam column array.
Figure 8:
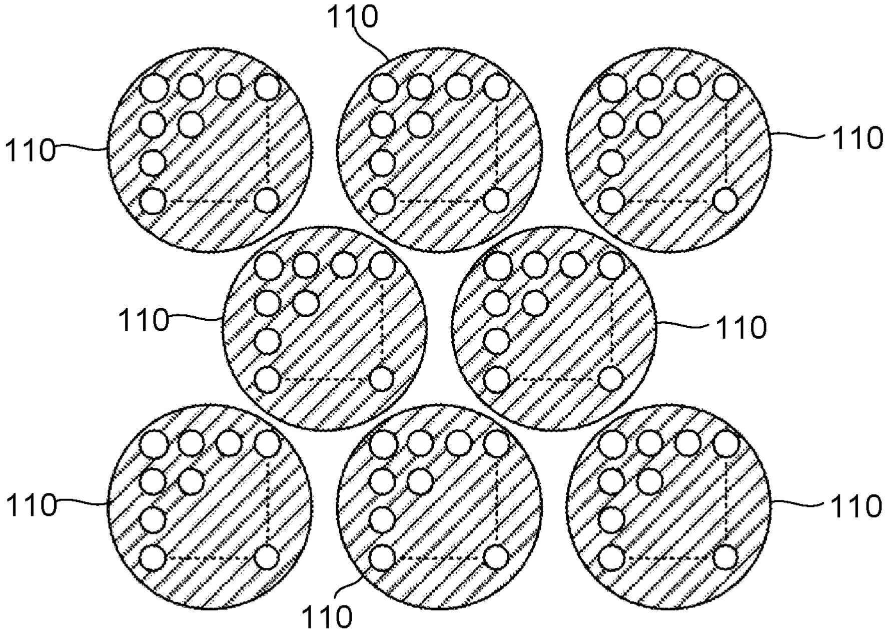
FIG. 8 is a schematic plan view of a hexagonal multi-beam column array.

In some embodiments, throughput is increased by using multiple sources 201. In some embodiments, as exemplified in FIGS. 5-8, a charged-particle multi-beam column array is provided. The charged-particle multi-beam column array may comprise a plurality of any of the embodiments of multi-beam column 110 described herein. Each multi-beam column 110 forms sub-beams from a beam of charged particles emitted by a different respective source 201. Each respective source 201 may be one source in a plurality of sources 201. At least a subset of the plurality of sources 201 may be provided as a source array. The source array may comprise a plurality of sources 201 provided on a common substrate. The multi-beam columns 110 are arranged to project the sub-beams simultaneously onto different regions of the same sample 208. An increased area of the sample 208 can thereby be processed (e.g. assessed) simultaneously. To achieve small spacing between beam columns 110, the objective lens array 118 and/or collimator array 150 of each multi-beam column 110 can be manufactured using techniques that are used to manufacture microelectromechanical systems (MEMS) or by using CMOS technology. The multi-beam columns 110 may be arranged adjacent to each other so as to project the charged particle sub-beams onto adjacent regions of the sample 208. Any number of multi-beam columns 110 may be used in principle. Preferably, the number of multi-beam columns 110 is in the range of from 9 to 200. In some embodiments, the multi-beam columns 110 are arranged in a rectangular array, as depicted schematically in FIG. 7. In some embodiments, the multi-beam columns 110 are arranged in a hexagonal array, as depicted schematically in FIG. 8. In other embodiments, the multi-beam columns 110 are provided in an irregular array or in a regular array having a geometry other than rectangular or hexagonal. Each multi-beam column 110 of the multi-beam column array may be configured in any of the ways described herein when referring to a single multi-beam column 110.

Each sub-beam of a multi-beam column 110 can be scanned across a respective individual scanning area of an object plane in which the sample 208 is placed. That is, the sample surface is exposed to the beam spot of each sub-beam. The sample surface exposed by each beam spot may be referred to as a sub-beam addressable area. The sub-beam addressable areas of all sub-beams of a multi-beam column 110 can be collectively referred to as the column-addressable area. The column-addressable area may not be contiguous because the scanning range of the sub-beams is less than the pitch of the objective lenses 118. A contiguous region of the sample 208 can be scanned by mechanically scanning the sample 208 in the object plane. The mechanical scan of the sample 208 can be a meander or step-and-scan type movement.

A contiguous area encompassing the column-addressable area is referred to herein as a region. A region can be a circle or polygon. The region is the smallest such shape that encompasses the column-addressable area. Regions addressed by adjacent beam columns 110 are adjacent on the sample 208 when placed in the object plane. Adjacent regions do not necessarily abut. The beam columns 110 may be arranged to cover at least a portion to all of the sample 208. The regions may be spaced apart so that a full portion can be projected onto by the beam column 110. The stage may move relative to the beam column 110 so that the regions associated with the beam columns 110 cover the full portion of the sample 208 without overlap. The footprint of a beam column 110 (i.e. the projection of the beam column 110 onto the object plane) is typically larger than the region onto which the beam column 110 projects sub-beams.

In any of the embodiments described herein, as exemplified in the embodiments of FIGS. 3-6, the multi-beam column 110 may comprise one or more aberration correctors 126 configured to reduce one or more aberrations in the sub-beams incident onto the sample 208. Each of at least a subset of the aberration correctors 126 may be up-beam of one or more of the objective lenses in the objective lens array 118, for example integrated with, or directly adjacent to, one or more of the objective lenses in the objective lens array 118 or, where present, one or more of the collimators in the collimator array 150. The aberration correctors 126 may be configured to apply one or more of the following to the sub-beams: focus correction, field curvature correction, astigmatism correction. Corrections may be applied to individual sub-beams (e.g. with each sub-beam potentially receiving a different correction) or to groups of sub-beams (e.g. with the sub-beams within each group all receiving the same correction for at least one type of correction). At least some of the groups may each consist of sub-beams that are all within the same multi-beam column 110. Alternatively or additionally, at least some of the groups may each include sub-beams that are in different multi-beam columns 110 in a multi-beam column array. Applying corrections in groups reduces routing requirements for the aberration correctors 126. The aberration correctors 126 may be implemented as described in European patent application number 20168281.2, hereby incorporated by reference, in particular to the disclosure of aperture assemblies and beam manipulator units for applying corrections to sub-beams.

In some embodiments, as exemplified in FIGS. 20-26, the charged-particle multi-beam column array comprises a focus corrector. The focus corrector may be configured to apply focus corrections to each individual sub-beam. In other embodiments, the focus corrector applies a group focus correction to each of a plurality of groups of sub-beams of the multi-beams. A focus correction can include any or all of corrections in the Z, Rx and Ry directions. Each group focus correction is the same for all of the sub-beams of the respective group. As mentioned above, applying corrections in groups may reduce routing requirements. In some embodiments, the focus corrector applies different corrections to sub-beams from different multi-beams. Thus, a focus correction applied to a multi-beam from one multi-beam column 110 may be different to a focus correction applied to a multi-beam from a different multi-beam column 110 in the same array. The focus corrector is thus able to correct for manufacturing or installation differences between different multi-beam columns 110 and/or differences in the height of the surface of the sample 208 between different multi-beam columns 110. Alternatively or additionally, the focus corrector may apply different corrections to different sub-beams within the same multi-beam. Thus, the focus corrector may be able to provide focus corrections at a finer level of granularity, thereby correcting for example for manufacturing variations within a multi-beam column 110 and/or for relatively short-range variations in the height of the surface of the sample 208.

In some embodiments, the focus corrector comprises a mechanical actuator 630. The mechanical actuator 630 applies each of one or more of the group focus corrections at least partly by mechanical actuation of a focus adjusting element. Mechanical actuation of the focus adjusting element may apply a tilt and/or shift of an entire multi-beam column 110 or just part of it, e.g. the objective lens array 118. For example, the focus adjusting element may comprise one or more electrodes of an objective lens array 118 and the mechanical actuator 630 may adjust the focus by moving one or more (e.g. all) electrodes of the objective lens array 118 (e.g. towards or away from the surface of the sample 208).

In some embodiments, the focus corrector applies each of one or more of the group focus corrections at least partly by changing an electrical potential applied to each of one or more electrodes. In some embodiments, as exemplified in FIGS. 20-26, the focus corrector comprises at least one corrector aperture array 601, 602. The corrector aperture array 601 defines a plurality of groups of corrector apertures 603 (each group containing a plurality of the corrector apertures 603). The corrector aperture array 601 may be integrated with, and/or directly adjacent to, an objective lens array 118. For example, the corrector aperture array 601 may be formed on an electrode (e.g. a body defining apertures) of the objective lens array 118.

Figure 20:
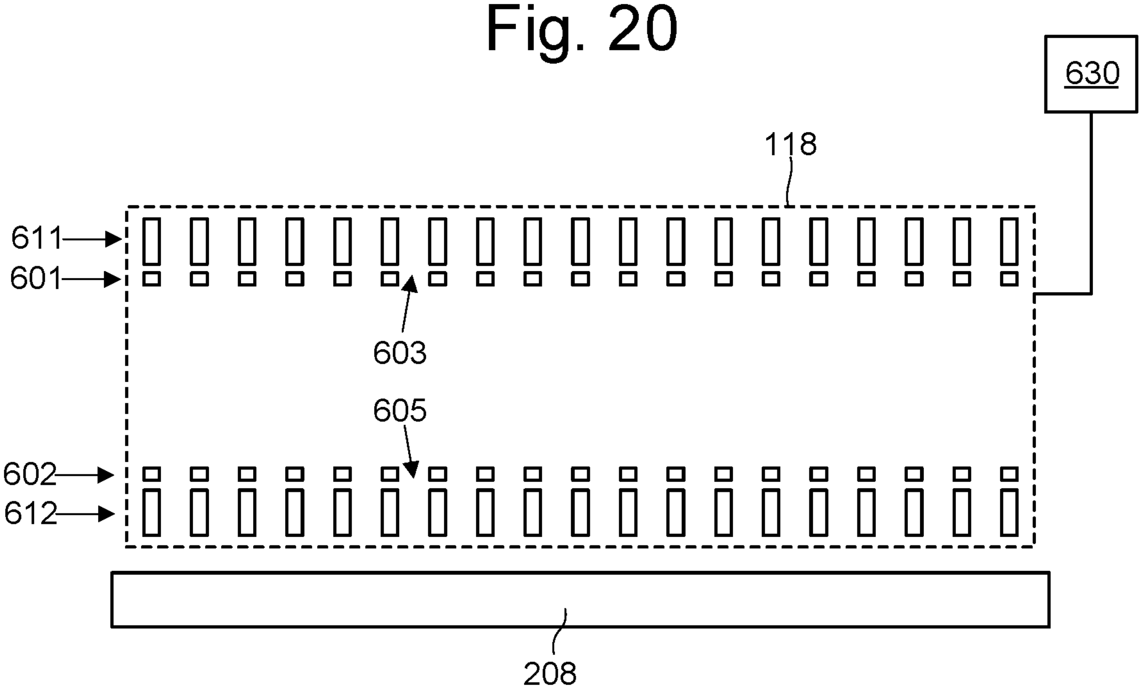
FIG. 20 is a schematic side sectional view of a corrector aperture array integrated with an objective lens array comprising two electrodes.

In the example shown in FIG. 20, the corrector aperture array 601 is formed on an up-beam electrode 611 of a two-electrode objective lens array 118. In the example shown in FIG. 20, a further corrector aperture array 602 is formed on a down-beam electrode 612 of the objective lens array 118. The further corrector aperture array 602 may define a further plurality of groups of corrector apertures 605.

Figure 21:
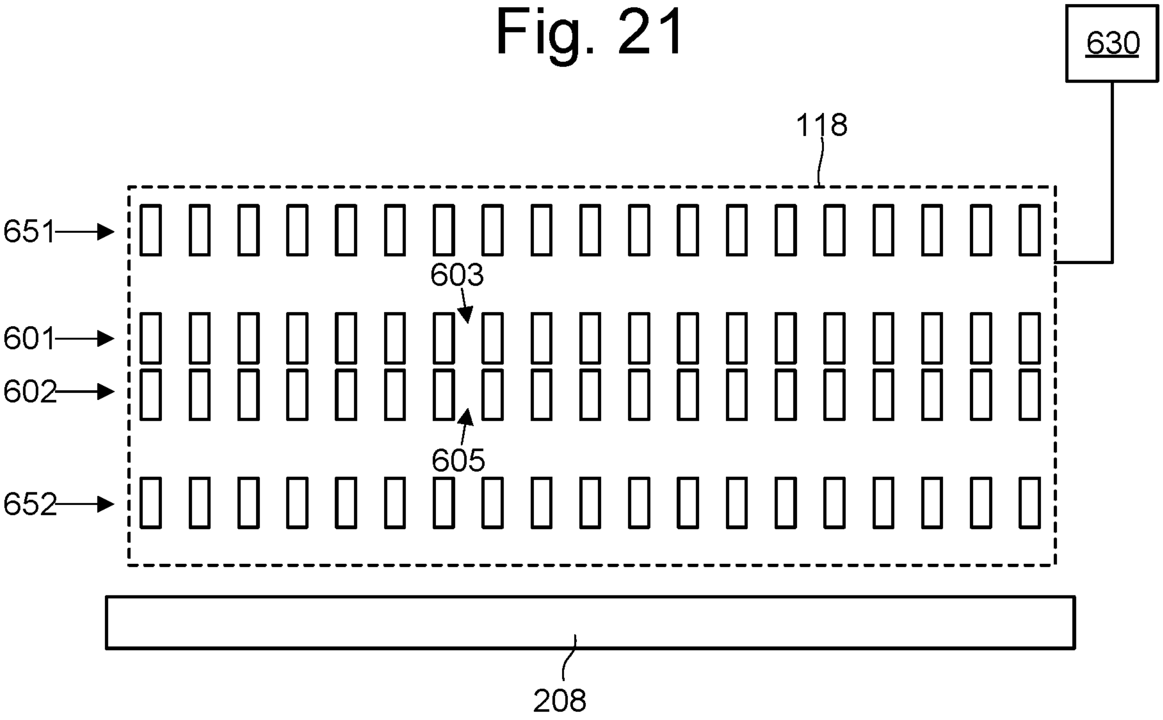
FIG. 21 is a schematic side section view of a corrector aperture array integrated with an objective lens array comprising three electrodes.

In the example shown in FIG. 21, the corrector aperture array 601 is formed on (or forms) an up-beam surface of a central electrode of a three-electrode objective lens array 118. In the example shown in FIG. 21, a further corrector aperture array 602, defining a further plurality of groups of corrector apertures 605, is formed on (or forms) a down-beam surface of the central electrode. Potential differences between the corrector aperture array 601 and the corrector aperture array 602 can be small enough to avoid any significant lensing effect in the region between the two corrector aperture arrays 601, 602. The three-electrode objective lens array 118 may be configured to operate as an Einzel lens array.

The at least one corrector aperture array 601, 602 may be formed on (or may form) any surface of any electrode in an objective lens array. It is desirable to provide the at least one corrector aperture array 601, 602 on an electrode having a stronger lensing effect than other electrodes in the objective lens array. This allows the at least one corrector aperture array 601, 602 to have the strongest effect for a given applied potential difference. In the arrangement of FIG. 21, the central electrode will typically have a stronger lensing effect than the up-beam electrode 651 and the down-beam electrode 652, so the two corrector aperture arrays 601, 602 are associated with the central electrode.

Each corrector aperture array 601, 602 comprises a respective electrode system 621, 622. Each electrode system 621, 622 comprises a plurality of electrodes. Each electrode applies a common electrical potential to aperture perimeter surfaces of all apertures in a different one of the groups of corrector apertures. Each electrode in each electrode system 621, 622 is electrically isolated from each other electrode in the electrode system 621, 622. Each electrode is electrically connected simultaneously to aperture perimeter surfaces of all apertures in a different one of the groups of corrector apertures 603, 605. Each corrector aperture 603, 605 is aligned along a sub-beam path with a respective objective lens in the objective lens array 118. In the example of FIGS. 20 and 21, each objective lens in the objective lens array 118 is defined by apertures in electrodes that are aligned with each other along a respective sub-beam path. Each corrector aperture 603, 605 may thus be aligned with apertures in up-beam and down-beam electrodes that are aligned with each other along a respective sub-beam path.

In some embodiments, in each of one or more of the groups of corrector apertures 603, 605, the objective lenses with which the corrector apertures 603, 605 are aligned are all in the same multi-beam column 110. Alternatively or additionally, in some embodiments, in each of one or more of the groups of corrector apertures 603, 605, at least a subset of the objective lenses with which the corrector apertures 603, 605 are aligned are in different multi-beam columns 110. The corrector aperture array 603 (and/or any further aperture array 605 provided) may use its respective plurality of electrodes to correct focus errors. The corrections are applied by using the electrodes to control an electric field in regions through which the sub-beams pass.

Within each corrector aperture array 601, 602, each electrode is capable of applying an electrical potential simultaneously to plural corrector apertures 603, 605 independently of the potential applied to other apertures in the corrector aperture array 601, 602. Fewer electrodes are therefore needed than would be the case if each electrode were connected to one corrector aperture only. Having fewer electrodes facilitates routing of the electrodes, thereby facilitating manufacture and optionally enabling a denser pattern of corrector apertures in the electrode. Controlling the potentials applied to groups of corrector apertures 603, 605 independently provides a greater level of control than if all of the corrector apertures were connected together electrically, such as when the corrector apertures are formed in an integral metallic plate. An improved balance of ease of manufacture and controllability of sub-beam manipulation is therefore provided.

In some embodiments, the electrode systems 621, 622 are each provided as a conductive layer or structure on a support structure. The electrode systems 621, 622 may be formed using a silicon-on-insulator process. The electrode systems 621, 622 may be provided as a conductive layer or structure on an insulating layer of silicon oxide. The electrode systems 621, 622 may comprise a metalized layer and/or a conductive semiconductor such as silicon or doped silicon. The electrode systems 621, 622 may comprise a metal, such as molybdenum or aluminum.

In some embodiments, as exemplified in FIGS. 22-25, each electrode in each of one or more of the electrode systems 621, 622 comprises an elongate conductive strip 631, 632. The respective elongate conductive strips 631, 632 in each electrode system may be implemented as a series of parallel plates for example. The conductive strips 631, 632 of each respective electrode system 621, 622 are preferably parallel to each other and/or substantially linear. Arranging the electrodes in conductive strips 631, 632 in the respective electrode system 621, 622 makes routing easier because electrical connections to the conductive strips 631, 632 can be made at the ends of the conductive strips 631, 632. In some arrangements, the conductive strips 631, 632 are arranged to extend to peripheral edges of the respective electrode system 621, 622, as shown schematically in FIGS. 22-25. Extending the conductive strips 631, 632 to the peripheral edges means that electrical connections to the conductive strips 631, 632 can be made at the peripheral edges. The peripheral edges of the electrode systems 621, 622 shown in the figures are schematic. The shape and relative size of the peripheral surfaces may be different in practical arrangements. The peripheral surfaces may be dimensioned, for example, to contain many more of the corrector apertures 603, 605 than shown in the figures.

Figure 22:
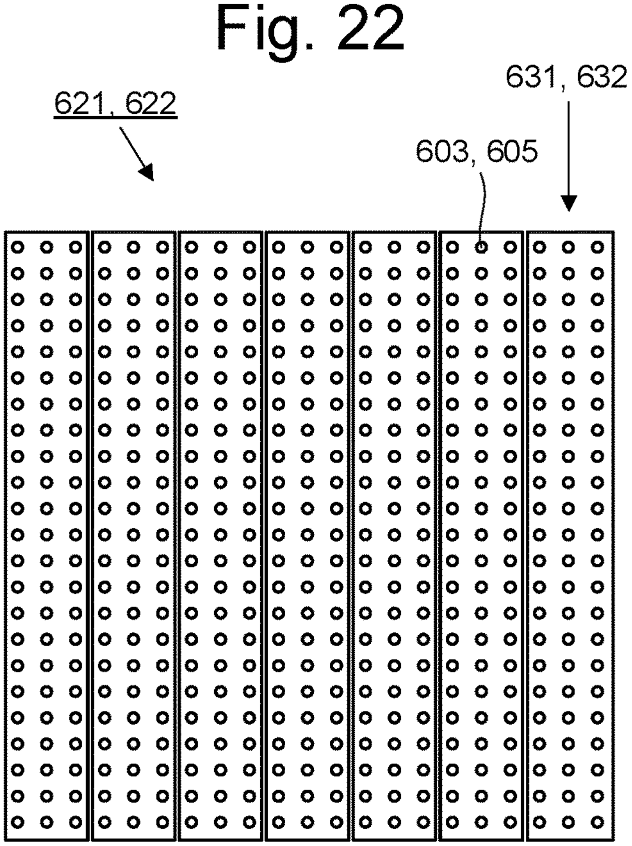
FIG. 22 is a schematic top view of electrodes in an example corrector aperture array, the electrodes comprising relatively wide elongate conductive strips aligned in a first direction.
Figure 23:
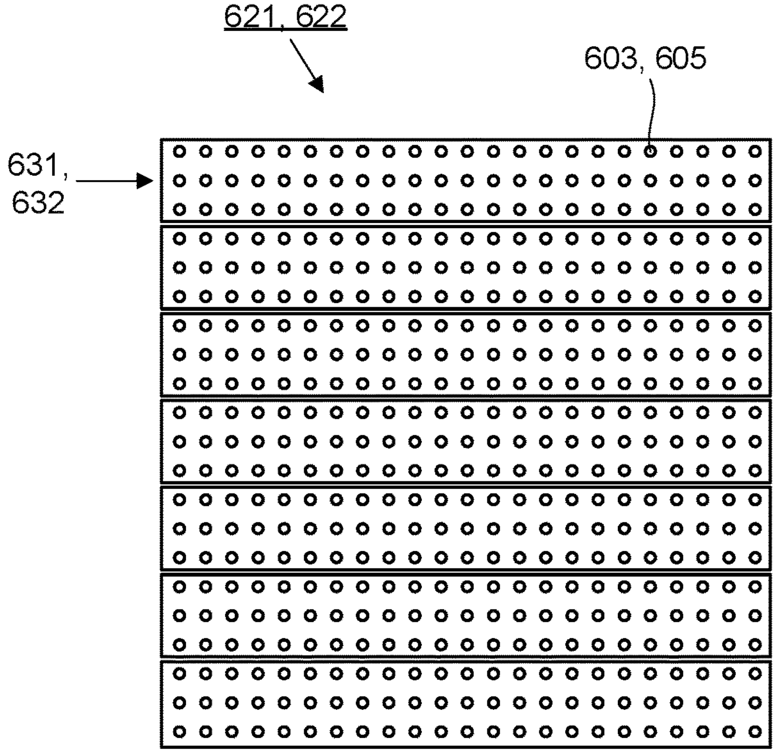
FIG. 23 is a schematic top view of electrodes in a further example corrector aperture array, the electrodes comprising relatively wide elongate conductive strips aligned in a second direction.
Figure 24:
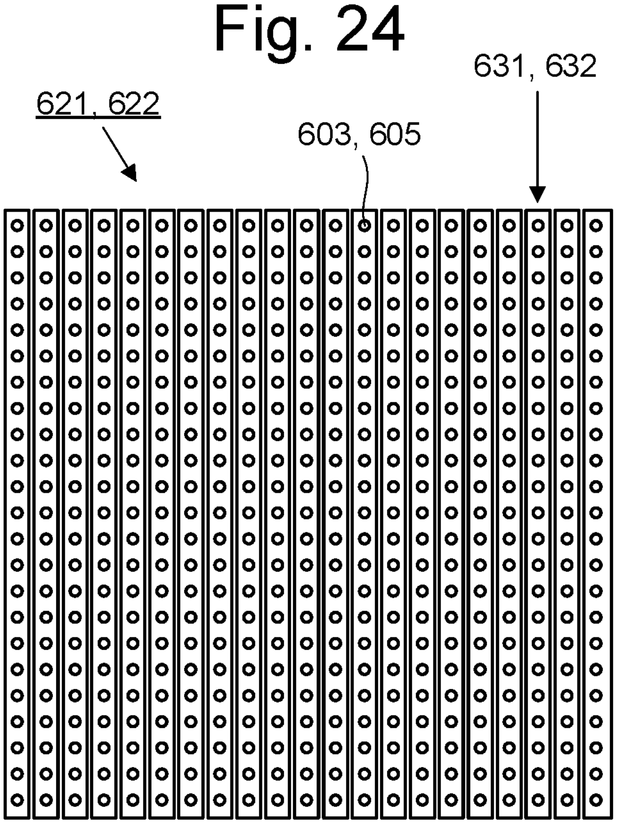
FIG. 24 is a schematic top view of electrodes in a further example corrector aperture array, the electrodes comprising relatively narrow elongate conductive strips aligned in the first direction.
Figure 25:
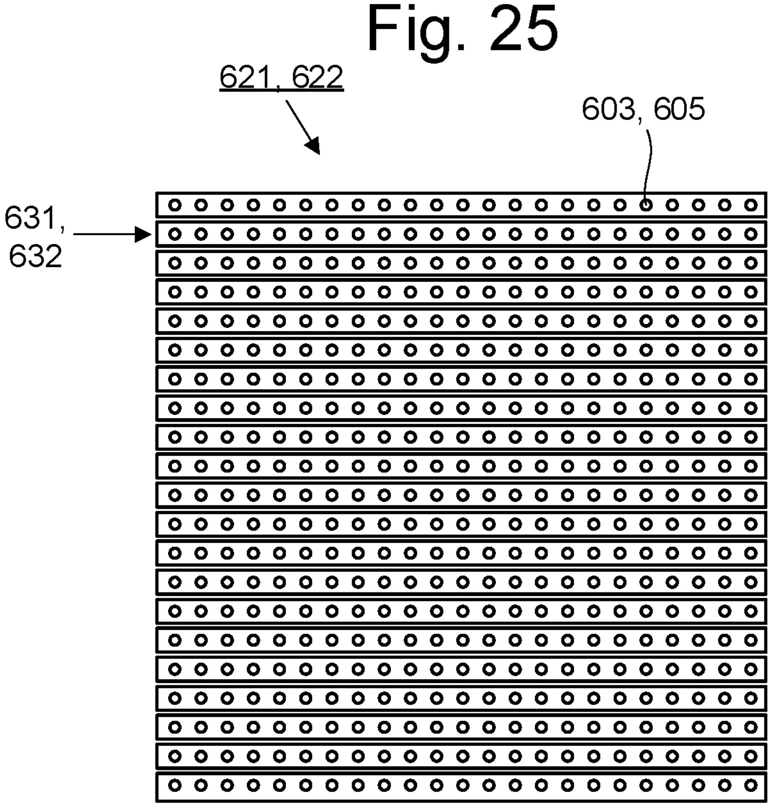
FIG. 25 is a schematic top view of electrodes in a further example corrector aperture array, the electrodes comprising relatively narrow elongate conductive strips aligned in the second direction.

In some embodiments, the corrector apertures 603, 605 are arranged in a regular array. The regular array has a repeating unit cell. The regular array may comprise a square array, rectangular array, or hexagonal array, for example. The corrector apertures 603, 605 may alternatively be arranged in an irregular arrangement comprising a plurality of the apertures 603, 605, which may be referred to as an irregular array. In arrangements having a regular array, the conductive strips 631, 632 may be made parallel to each other and perpendicular to a principle axis of the array. In the examples shown in FIGS. 22-26, the corrector apertures 603, 605 are arranged in a square array. The regular array may have one principle axis being horizontal in the plane of the page and another principle axis being vertical in the plane of the page. The conductive strips 631, 632 in FIGS. 22 and 24 are thus parallel to each other and perpendicular to the horizontal principle axis. The conductive strips 631, 632 in FIGS. 23 and 25 are parallel to each other and perpendicular to the vertical principle axis.

The conductive strips 631, 632 may each have a short axis and a long axis. In the example of FIGS. 22 and 24, each short axis is horizontal, and each long axis is vertical. In the example of FIGS. 23 and 25, each short axis is vertical, and each long axis is horizontal. A pitch of the conductive strips 631, 632 parallel to the short axis may be larger than a pitch of the array parallel to the short axis. Each vertical conductive strip may therefore comprise multiple columns of apertures 603, 605 and/or each horizontal strip may therefore comprise multiple rows of apertures 603, 605. This approach provides a good balance between controllability and ease of manufacture. Alternatively, a pitch of the conductive strips 631, 632 parallel to the short axis may be equal to the pitch of the array parallel to the short axis, which provides finer spatial control of the electrical field.

In some embodiments, plural corrector aperture arrays 601, 602 are provided. The corrector aperture arrays 601, 602 may be aligned with each other along sub-beam paths. In some embodiments, conductive strips 631 in the electrode system 621 of one of the corrector aperture arrays 601 are non-parallel with, e.g. perpendicular to, conductive strips 632 in the electrode system 621 of a different one of the corrector aperture arrays 602. This arrangement may be particularly preferable, for example, where the conductive strips 631, 632 are parallel to each other in each of the electrode systems 621, 622. For example, the electrode system 621 of one of the corrector aperture arrays 601 may comprise conductive strips 631 as shown in FIG. 22 or 24 and the electrode system 622 of a different one of the corrector aperture arrays 602 may comprise conductive strips 632 as shown in FIG. 23 or 25 or vice versa. Crossing the conductive strips 631, 632 in different electrode systems 621, 622 in this way provides a wide range of possible combinations of potential difference between corresponding apertures 603, 605 in the respective corrector aperture arrays without making routing of electrical connections to the respective conductive strips 631, 632 more difficult.

Figure 26:
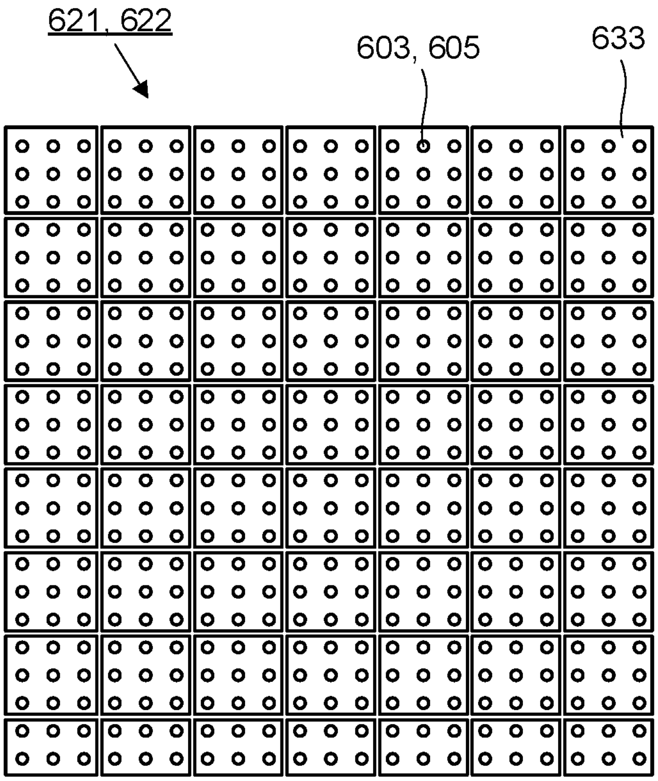
FIG. 26 is a schematic top view of electrodes of a further example corrector aperture array, the electrodes comprising lower aspect ratio, tessellating conductive elements.

In a further arrangement, as exemplified in FIG. 26, the plurality of electrodes of an electrode system 621, 622 comprises a plurality of conductive elements 633 that tessellate with each other. In the example shown, the conductive elements 633 are square. Other tessellating shapes may be used, such as rectangles, rhomboids, parallelograms, and hexagons and/or repeating groups of shapes that tessellate This approach may provide more degrees of freedom for manipulating charged particles in comparison to arrangements using conductive strips as discussed above with reference to FIGS. 22-25, but routing of electrical signals to the individual electrodes may be more complex.

In some embodiments, one or more scanning deflectors (not shown) may be integrated with, or directly adjacent to, one or more of the objective lenses for scanning the sub-beams 211, 212,214 over the sample 208. In some embodiments, the scanning deflectors may be used as described in EP2425444A1 (hereby incorporated by reference in its entirety, and in particular to the disclosure of the use of an aperture array as a scanning deflector).

The aberration correctors 126 may be CMOS based individual programmable deflectors as disclosed in EP2702595A1 or an array of multipole deflectors as disclosed in EP2715768A2, of which the descriptions of the beamlet manipulators in both documents are hereby incorporated by reference.

In some embodiments, the aberration correctors 126 comprise field curvature correctors configured to reduce field curvature. In some embodiments, the field curvature correctors are integrated with, or adjacent to, or even directly adjacent to, one or more of the objective lenses. In some embodiments, the field curvature correctors comprise passive correctors. Passive correctors could be implemented, for example, by varying the diameter and/or ellipticity of apertures of the objective lenses. The passive correctors may be implemented for example as described in EP2575143A1 hereby incorporated by reference in particular to the disclosed use of aperture patterns to correct astigmatism. The passive nature of passive correctors is desirable because it means that no controlling voltages are required. In embodiments where the passive correctors are implemented by varying the diameter and/or ellipticity of apertures of the objective lenses, the passive correctors provide the further desirable feature of not requiring any additional elements, such as additional lens elements. A challenge with passive correctors is that they are fixed, so the required correction needs to be carefully calculated in advance. Additionally or alternatively, in some embodiments, the field curvature correctors comprise active correctors. The active correctors may controllably correct charged particles to provide the correction. The correction applied by each active corrector may be controlled by controlling the potential of each of one or more electrodes of the active corrector. In some embodiments, passive correctors apply a coarse correction and active correctors apply a finer and/or tunable correction.

Figure 9:
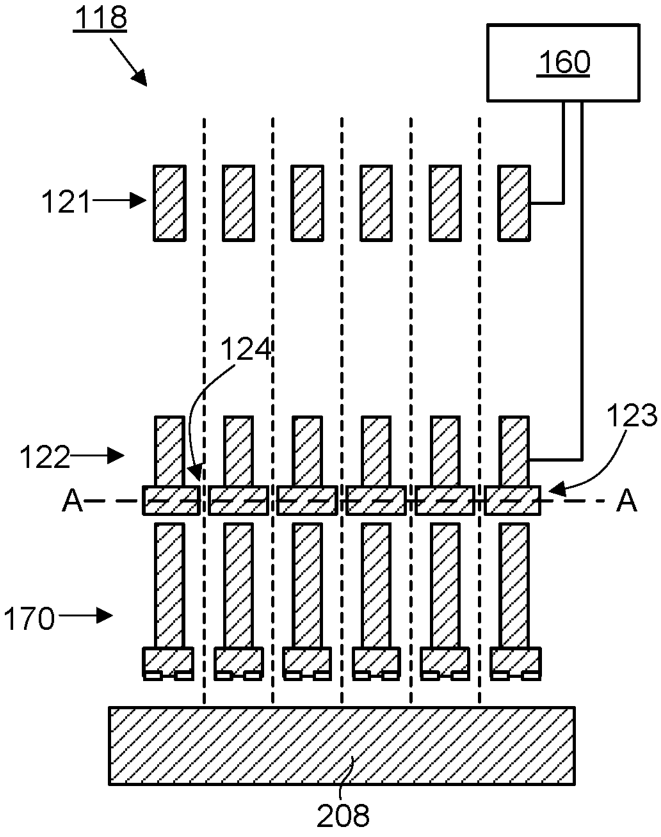
FIG. 9 is a schematic side sectional view of portions of electrodes forming decelerating objective lenses in a multi-beam column with a down-beam aperture array.
Figure 10:
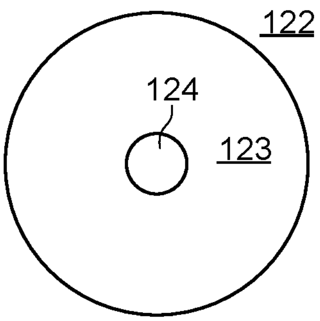
FIG. 10 is a schematic magnified top sectional view relative to plane A-A in FIG. 9 showing an aperture in the down-beam aperture array.

A further example of an objective lens array 118 and a detector 170 is depicted in FIGS. 9 and 10. This configuration of objective lens array 118 and a detector 170 can be used in combination with any of the multi-beam columns 110 and/or multi-beam column arrays discussed herein. In the arrangement shown, the objective lens array 118 comprises a first electrode 121 and a second electrode 122. The second electrode 122 is between the first electrode 121 and the sample 208. The first electrode 121 and the second electrode 122 may each comprise a conductive body with a plurality of lens apertures that define a corresponding plurality of objective lenses 118. Each objective lens 118 may be defined by a pair of aligned lens apertures, with one of the lens apertures being formed by the first electrode 121 and one of the lens apertures being formed by the second electrode 122. The lens apertures may be circular or non-circular.

Each objective lens 118 can be configured to demagnify a sub-beam by a factor greater than 10, desirably in the range of 50 to 100 or more. An electric power source 160 applies a first potential to the first electrode 121. The electric power source 160 applies a second potential to the second electrode 122. In some embodiments, the first and second potentials are such that a sub-beam passing through the objective lens array 118 is decelerated to be incident on the sample 208 with a desired landing energy. The second potential can be similar to the potential of the sample, e.g. about 50 V more positive. Alternatively the second potential can be in the range of from about +500 V to about +1,500 V. The first and/or second potentials can be varied per aperture to effect focus corrections.

To provide the objective lens array 118 with a decelerating function, so that the landing energy can be determined, it is desirable to change the potential of the second electrode and the sample 208. To decelerate electrons the second electrode is made more negative than the first electrode. The highest electrostatic field strength occurs when the lowest landing energy is selected. The distance between the second electrode and first electrode, lowest landing energy and maximum potential difference between second electrode and first electrode are selected so that the resulting field strength is acceptable. For higher landing energies, the electrostatic field becomes lower (less deceleration over the same length).

Because the charged particle (e.g. electron) optics configuration between the source 201 and the objective lens array 118 remains the same, the beam current remains unchanged with changes in landing energy. Changing the landing energy can affect resolution, either to improve or reduce it.

In some embodiments, as exemplified in FIGS. 9 and 10, the multi-beam column 110 further comprises a down-beam aperture array 123. In the down-beam aperture array 123 is defined a plurality of apertures 124 down-beam from the objective lens array 118. The down-beam aperture body 123 may therefore be down-beam of the objective lens array 118. Each of the apertures 124 is aligned with a corresponding objective lens 118. Each of the apertures 124 of the down-beam aperture array 124 thus has a corresponding objective lens in the objective lens array 118. The alignment is such that a portion of a sub-beam from the objective lens 118 can pass through the aperture 124 and impinge onto the sample 208. Each aperture 124 is furthermore configured to allow only a selected portion (e.g. a central portion) of the sub-beam incident onto the down-beam aperture array from the objective lens to pass through the aperture 124. The aperture 124 may for example have a cross-sectional area that is smaller than a cross-sectional area of a corresponding aperture in the sub-beam defining aperture array 152 or of a corresponding sub-beam incident onto the objective lens array 118. The apertures of the down-beam aperture array may thus be of smaller dimension (i.e. smaller area and/or smaller diameter and/or smaller other characteristic dimension) than the corresponding apertures defined in the sub-beam defining aperture array 152 and/or the objective lens array 118.

It is desirable to provide the down-beam aperture array 123 up-beam of the detector 170, as exemplified in FIGS. 9 and 10. Providing the down-beam aperture array 123 up-beam of the detector 170 ensures that the down-beam aperture array 123 will not obstruct charged particles emitted from the sample 208 and prevent them from reaching the detector 170.

The down-beam aperture array 123 can thus be used to ensure that each sub-beam exiting an objective lens of the objective lens array 118 has passed through the center of the respective lens. This can be achieved without requiring a complex alignment procedure to ensure that sub-beams incident onto the objective lenses are well aligned with the objective lenses. Moreover, the effect of the down-beam aperture array 123 will not be disrupted by column alignment actions, source instabilities or mechanical instabilities.

In some embodiments, a ratio of a diameter of an aperture in the sub-beam defining aperture array 152 to a diameter of the corresponding aperture 124 in the down-beam aperture array 123 is equal to or greater than 3, optionally equal to or greater than 5, optionally equal to or greater than 7.5, optionally equal to or greater than 10. In one particular arrangement, for example, an aperture in the sub-beam defining aperture array 152 has a diameter of about 50 microns and a corresponding aperture 124 in the down-beam aperture body 123 has a diameter of about 10 microns. In another arrangement, an aperture in the sub-beam defining aperture array 152 has a diameter of about 100 microns and a corresponding aperture 124 in the down-beam aperture body 123 has a diameter of about 10 microns. It is desirable for only the part of the beam that has gone through the center of the objective lens 118 to be selected by the aperture 124. Each objective lens is formed by the electrostatic field between electrodes 121 and 122. In some embodiments, each objective lens consists of two elementary lenses (each with focal length=4*beamEnergy/Efield): one at the bottom of electrode 121 and one at the top of electrode 122. The dominant lens may be the one at the top of electrode 122 (as the beam energy may be small there, for example 2.5 kV compared to 30 kV close to electrode 121, which would make the lens approximately 12× stronger than the other). It is desirable for the portion of the beam passing though the center of the aperture at the top of electrode 122 to be passing through aperture 124. Because the distance in z between the top of electrode 122 and the aperture 124 is very small (typically 100 to 150 microns for example), even for relatively large angles of the beam the correct portion of the beam is selected.

Arrangements comprising a down-beam aperture array 123 configured to operate as described above with reference to FIGS. 9 and 10 may be used in multi-beam columns 110 with a collimator array 150 down-beam from the sub-beam defining aperture array 152 (e.g. as discussed above with reference to FIG. 3 for example) and/or in multi-beam columns 110 without such a collimator array 150 (e.g. as discussed above with reference to FIG. 4 for example).

In the particular example of FIGS. 9 and 10, the down-beam aperture body 123 is shown as an element formed separately from a bottom electrode of the objective lens array 118. In other embodiments, the down-beam aperture body 123 may be formed integrally with a bottom electrode of an objective lens array 118 (e.g. by performing lithography to etch away cavities suitable for functioning as lens apertures and beam-blocking apertures on opposite sides of the substrate).

In some embodiments, the apertures 124 in the down-beam aperture array 123 are provided at a distance down-beam from at least a portion of a corresponding lens aperture in a bottom electrode of the corresponding objective lens array 118 by a distance equal to or larger than a diameter of the lens aperture, preferably at least 1.5 times larger than the diameter of the lens aperture, preferably at least 2 times larger than a diameter of the lens aperture.

It is generally desirable to position the down-beam aperture array 123 adjacent to the electrode of each objective lens that has the strongest lensing effect. In the example of FIGS. 9 and 10, the bottom electrode 122 will have the strongest lensing effect and the down-beam aperture array 123 is positioned adjacent to this electrode. Where an objective lens array 118 comprises more than two electrodes, such as in an Einzel lens configuration as depicted in FIG. 21, the electrode having the strongest lensing effect will typically be the middle electrode. In this case, it would be desirable to position the down-beam aperture array 123 adjacent to the middle electrode. It is generally desirable also to position the down-beam aperture array 123 in a region where the electric field is small, preferably in a substantially field-free region. This avoids or minimizes disruption of a desired lensing effect by the presence of the down-beam aperture array 123.

FIGS. 11-17 provide further details about how detectors for detecting charged particles emitted by the sample 208 can be configured, referring specifically to the example scenario where the charged particles are electrons. Any of the arrangements discussed below may be used to implement the objective lens array 118 and/or detector 170 in any of the embodiments of multi-beam column 110 and/or multi-beam column arrays discussed herein. For example, the detector 170 may be configured in the same way as the detector module 402 and/or 502 referred to below.

As exemplified in FIGS. 11-15, objective lenses may comprise multi-electrode lenses in which a bottom electrode is integrated with a CMOS chip detector array. The multi-electrode lens may comprise three electrodes, as exemplified in FIG. 11, two electrodes, as exemplified in FIG. 12, or a different number of electrodes. Integration of a detector array into the objective lenses replaces the need for a secondary column for detecting the secondary electrons and backscattered electrons. The CMOS chip is preferably orientated to face a sample (because of the small distance (e.g. 100 μm) between wafer and bottom of the electron-optical system). In some embodiments, capture electrodes to capture the secondary electron signals are provided. The capture electrodes can be formed in the metal layer of, for example, a CMOS device. The capture electrodes may form the bottom layer of the objective lenses. The capture electrode may form the bottom surface in a CMOS chip. The CMOS chip may be a CMOS chip detector. The CMOS chip may be integrated into the sample facing surface of an objective lens assembly. The capture electrodes are examples of sensor units or detectors for detecting secondary electrons. The capture electrodes can be formed in other layers. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

Sensor units (detectors) associated with a bottom or sample facing surface of an objective lens (objective lens array) are beneficial because the secondary and/or back-scattered electrons may be detected before the electrons encounter and become manipulated by an electron-optical element of the electron-optical system. Beneficially the time taken for detection of such a sample emanating electron may be reduced, preferably minimized.

In order to maximize the detection efficiency it is desirable to make the electrode surface as large as possible, so that substantially all the area of the array objective lens (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single electrode surrounds each aperture. In some embodiments, a plurality of electrode elements is provided around each aperture. The electrode elements are examples of sensor elements or detectors. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

A larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. The electrode may be circular, for example annular. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller, especially in case a larger electrode gives only a slightly larger detection efficiency but a significantly larger crosstalk.

The back-scattered and/or secondary electron current collected by the electrode is amplified. The purpose of the amplifier is to enable sufficiently sensitive measurement of the current received or collected by the sensor unit, and therefore of the number of back-scattered and/or secondary electrons. The current can be measured directly or via an associated potential difference over a resistor through which the current is flowing. Several types of amplifier design may be used to amplify back-scattered and/or secondary electron current collected by the electrode, for example a Trans Impedance Amplifier (TIA). In such a Trans-Impedance Amplifier, the voltage output of the TIA is equal to the TIA resistance ($R_{TIA}$) multiplied by the measured current.

The larger the $R_{TIA}$, the higher the amplification. However, the bandwidth is determined by the RC time, which is equal to $R_{TIA}$ multiplied by the sum of the capacitances on the entrance side of the TIA.

A finite RC time has a similar effect as a larger electron optics spotsize, so it gives effectively a blur contribution in the deflection direction. Given the blur contribution budget of the detector and the deflection velocity the allowed RC time is determined. Given this RC time and the entrance capacitances $R_{TIA}$ can be determined.

Based on the back-scattered and/or secondary electron current and $R_{TIA}$ the signal voltage is determined.

Noise contributions of the detector should be compared to the shot noise of the back-scattered and/or secondary electron current. Taking only the shot noise of the primary electron beam into account, the current noise per sqrt (Hz) due to shot noise is significantly larger than the voltage noise of a state of the art CMOS amplifier of typically ~1 nV/sqrt (Hz) as demonstrated below. The rough calculations set out below demonstrate that the proposed electrode is feasible from a noise point of view.

$$N_{PE\_def} := 5000 \tag{1}$$

$$I_{beam} := 1\ \text{nA} \tag{2}$$

$$d_{def} := 4\ \text{nm} \tag{3}$$

$$N_{pix\_defect} := 4 \tag{4}$$

$$\text{blur}_{RC} := 0.5\ \text{nm} \tag{5}$$

$$C_{detector} := \varepsilon_0 * 3 * \frac{0.25 * \pi * (100\ \mu\text{m})^2}{1\ \mu\text{m}} = 2.086 * 10^{-13}\ F \tag{6}$$

$$I_{sn\_noise} := \sqrt{2 * Q_e * I_{beam}} = 1.79 * 10^{-14} * \frac{A}{\sqrt{\text{Hz}}} \tag{7}$$

$$t_{defect} := \frac{N_{PE\_def} * Q_e}{I_{beam}} = 0.801\ \mu\text{s} \tag{8}$$

$$l_{scan\_defect} := d_{def} * \sqrt{N_{pix\_defect}} = 8\ \text{nm} \tag{9}$$

$$v_{scan} := \frac{l_{scan\_defect}}{t_{defect}} = 9.986\ \frac{\text{mm}}{\text{s}} \tag{10}$$

$$t_{RC} := \frac{\text{blur}_{RC}}{v_{scan}} := 50.069\ \text{ns} \tag{11}$$

$$R_{detector} := \frac{t_{RC}}{C_{detector}} = 2.5 * 10^5\ \Omega \tag{12}$$

$$V_{sn} := I_{sn\_noise} * R_{detector} = 4.296\ \frac{nV}{\sqrt{\text{Hz}}} \tag{13}$$

$$V_{sn} := \frac{\sqrt{2} * Q_e^{\frac{3}{2}}}{\sqrt{I_{beam}}} * \frac{\text{blur}_{RC} * N_{PE\_def}}{C_{detector} * d_{def} * \sqrt{N_{pix\_defect}}} = 4.296\ \frac{nV}{\sqrt{\text{Hz}}} \tag{14}$$

The above calculations can be explained as follows. It is assumed that the number of primary electrons required to detect a defect is 5000 (equation 1), the beam current is 1 nA (equation 2) the diameter of a defect is 4 nm (equation 3) and the number of pixels per defect is 4 (equation 4). We assume that a blur due to the finite RC time of the amplifier of 0.5 nm is acceptable (equation 5). The capacitance of the detector can be calculated from the geometry of the arrangement, for example, as indicated in equation 6 where 3 is the dielectric constant of the insulator underlying the capture electrode, 100 µm is the diameter of the capture electrode and 1 µm is the thickness of the insulator underneath the capture electrode. The intrinsic shot noise is calculated as in equation 7. The time to image one defect is calculated as in equation 8 where $Q_e$ is the electron charge. The length of a scan to detect a defect is calculated in equation 9 and the scanning velocity is calculated in equation 10. The RC time to be achieved is calculated in equation 11 and therefore the resistance of the detector is calculated in equation 12 and the resulting voltage noise in equation 13. Equation 14 combines the previous equations into a single equation to show dependencies. The typical voltage noise level that can be achieved in CMOS amplifiers is in the order of 1 nV/sqrt (Hz)—which this typical noise level of a CMOS amplifier. So it is plausible that the noise is dominated by the fundamental shot noise, and not by the voltage noise added by the CMOS amplifier. Because of this it is plausible that the proposed electrode is feasible from a noise point of view. That is a typical CMOS amplifier noise is sufficiently good to have a noise level that is small relative to the shot noise. (Even if it is large relative the shot noise, the arrangement could still work, but the effectiveness in terms of bandwidth or throughput (i.e. speed) could be reduced).

Figure 16:
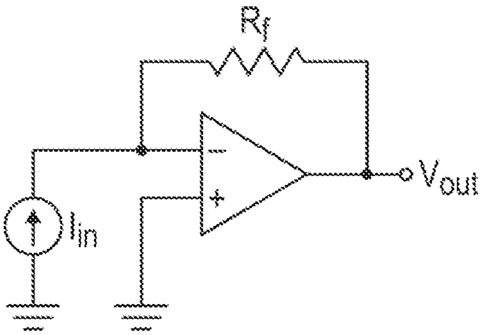
FIG. 16 is a schematic diagram of a theoretical trans impedance amplifier
Figure 17:
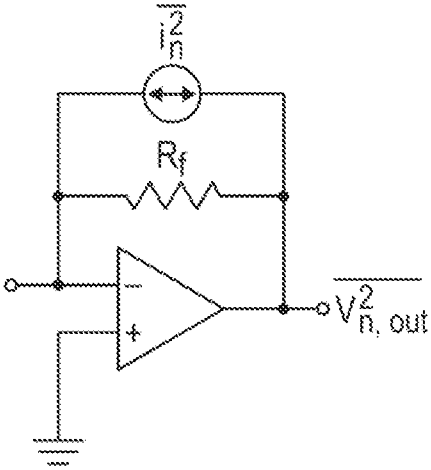
FIG. 17 is a schematic diagram of a trans impedance amplifier indicating the effect of thermal noise.

FIG. 16 is a schematic diagram of a theoretical TIA in which the voltage output Vout is simply the product of the measured current $I_{in}$ and the feedback resistance $R_f$. However, a real TIA has noise, in particular shot noise in the input $i_{sn}$ and thermal noise in the feedback resistor $i_n$ as depicted in FIG. 17. In most cases thermal noise dominates. The voltage noise at the output $v_n$ is given by:

$$v_n = \sqrt{4 \cdot k_b \cdot T \cdot R_f} \tag{15}$$

where kb is the Boltzmann constant. The current noise at the entrance to the TIA is therefore:

$$i_n = \sqrt{\frac{4.k_b.T}{R_f}} \tag{16}$$

whereas the shot noise is given by:

$$i_{sn} = \sqrt{2 \cdot Q_e \cdot I_{in}} \tag{17}$$

Therefore if the feedback resistance is increased, the thermal noise becomes lower relative to the shot noise of the input current (i.e. the back-scattered and/or secondary electron current).

It can be shown that the approach remains practical taking account of the effect of shot noise, by assuming that the number of electrons required to detect each defect is increased to 10,000; a blur budget of 2 nm is set; and the electrode diameter is reduced to 50 µm. In that case, the capacitance of the electrode becomes about 0.011 pF requiring a resistance of about $3.6 \times 10^7 \Omega$, resulting in a level of thermal noise about 20% greater than the shot noise. Therefore, various different arrangements of the proposed detector are feasible. The capacitance of the electrode can also be controlled by varying the thickness of an adjacent dielectric layer, which may be in the range of about 1 to about 5 µm.

Figure 11:
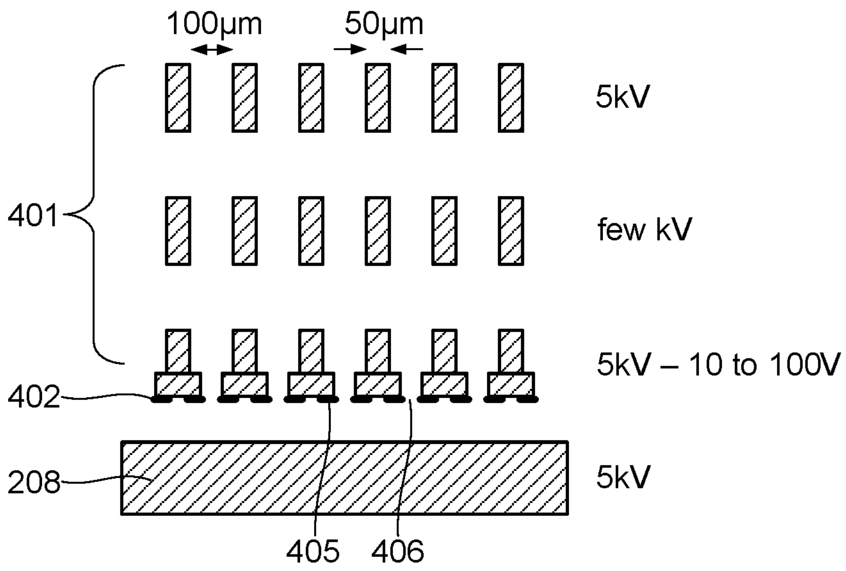
FIG. 11 is a schematic side sectional view of an electron detection device integrated with a three-electrode objective lens array.
Figure 12:
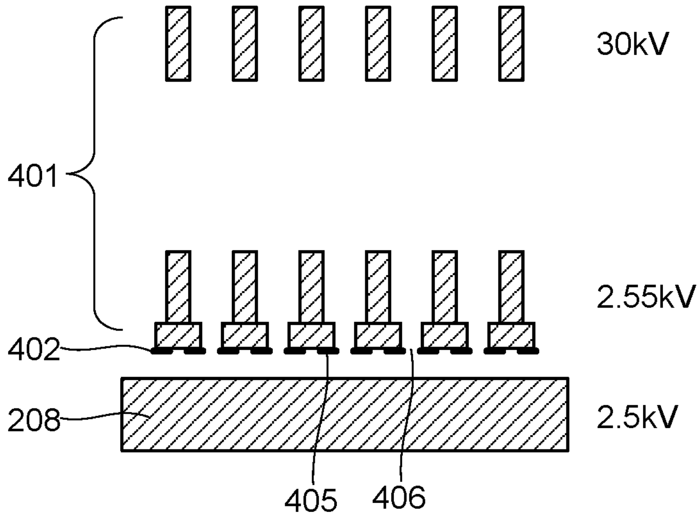
FIG. 12 is a schematic side sectional view of an electron detection device integrated with a two-electrode objective lens array.
Figure 13:
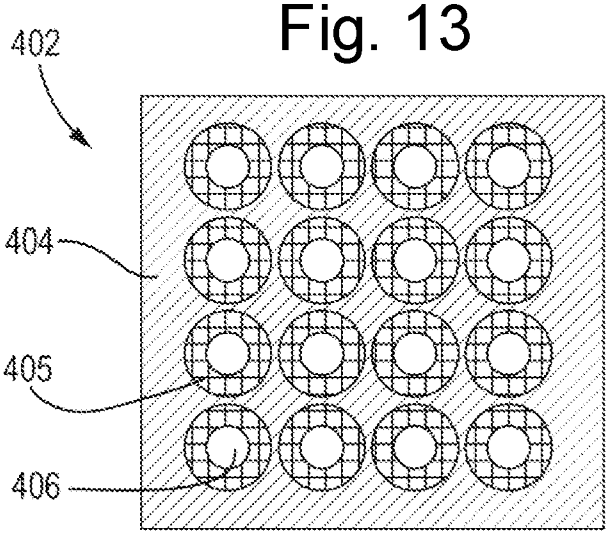
FIG. 13 is a bottom view of a detector module of the type depicted in FIG. 11 or 12.
Figure 14:
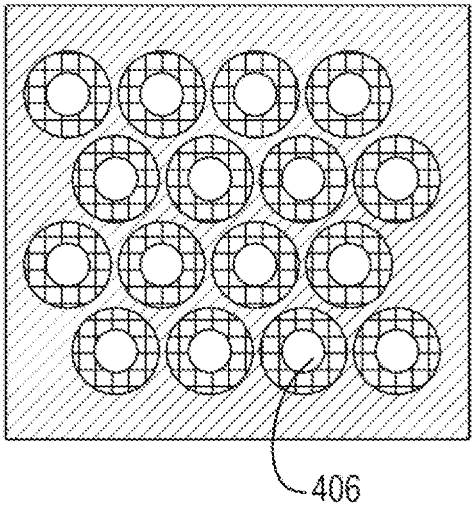
FIG. 14 is a bottom view of an alternative detector module where beam apertures are in a hexagonal close packed array.

Exemplary embodiments are shown in FIGS. 11 and 12 which illustrate a multibeam objective lens 401 (which may be referred to as an objective lens array) in schematic cross section. On the output side of the objective lens 401, the side facing the sample 208, a detector module 402 is provided. FIG. 13 is a bottom view of detector module 402 which comprises a substrate 404 on which are provided a plurality of capture electrodes 405 each surrounding a beam aperture 406. Beam apertures 406 are large enough not to block any of the primary electron beams. Capture electrodes 405 can be considered as examples of sensor units or detectors which receive back-scattered or secondary electrodes and generate a detection signal, in this case an electric current. The beam apertures 406 may be formed by etching through substrate 404. In the arrangement shown in FIG. 13, the beam apertures 406 are shown in a rectangular array. The beam apertures 406 can also be differently arranged, e.g., in a hexagonal close packed array as depicted in FIG. 14.

Figure 15:
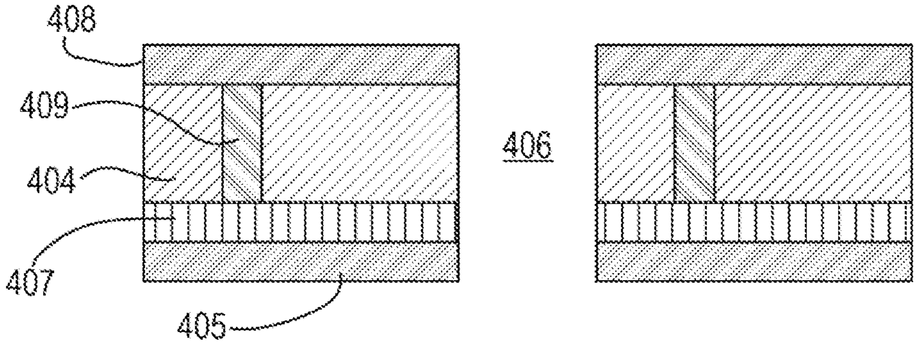
FIG. 15 depicts a part of a detector module in cross section.

FIG. 15 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallization layer.

A wiring layer 408 is provided on the backside of substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

Figure 18:
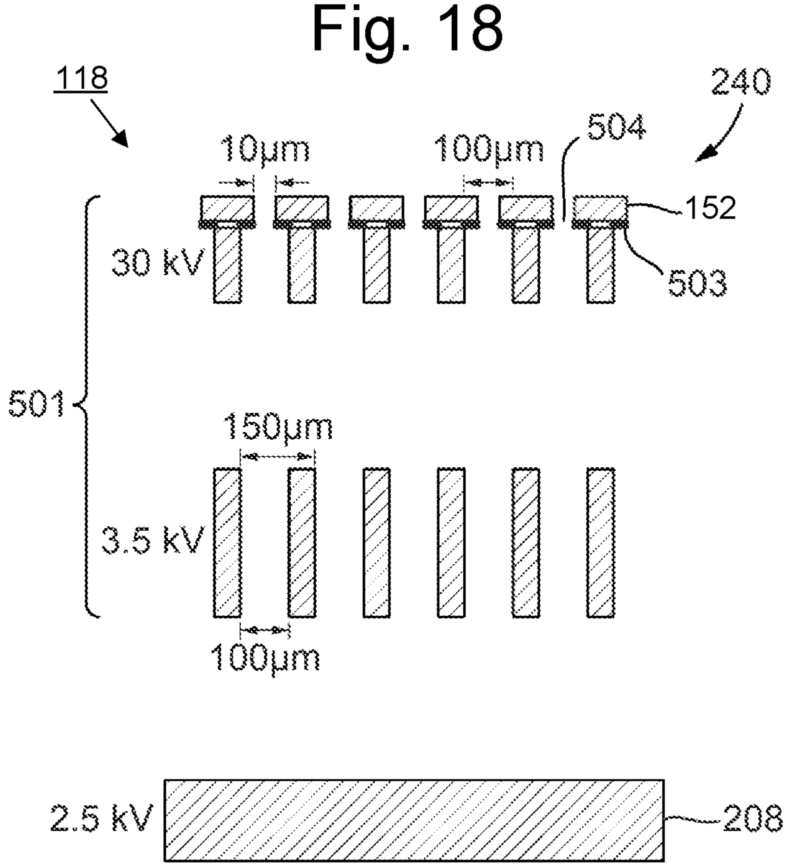
FIG. 18 is a schematic side sectional view of an electron detection device located in a down-beam surface of a sub-beam defining aperture array.
Figure 19:
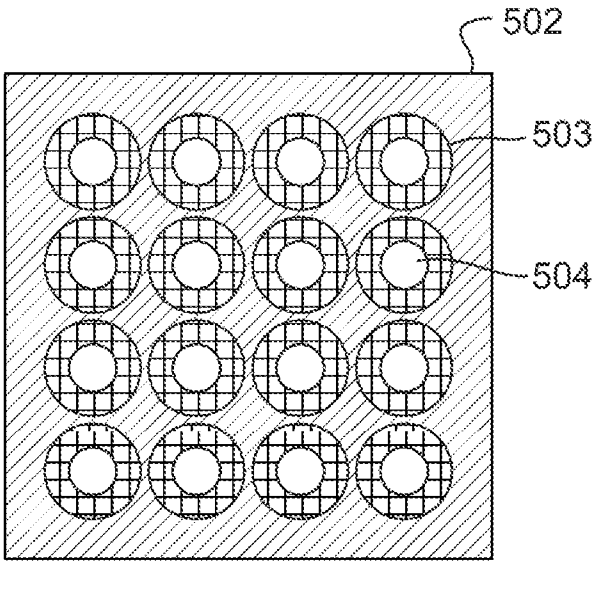
FIG. 19 is an end view of the down-beam surface of the sub-beam defining aperture array of FIG. 18.

FIGS. 18 and 19 exemplify an alternative example in which a detector for detecting charged particles emitted from the sample 208 (an electron detection device 240 in this example) is located in a down-beam surface of a sub-beam defining aperture array 152.

As shown in FIG. 16, an electron detection device 240 in this example comprises a sub-beam defining aperture array 152 provided with a plurality of sensor units 503 surrounding respective beam apertures 504. Sub-beam defining aperture array 152 is mounted on the upper electrode (further from sample 208) of a decelerating array of objective lenses 501 (which may be referred to as an objective lens array). The sensor units 503 face toward the sample 208. The sensor units may be positioned with the sensing surfaces located between the upbeam and downbeam facing surfaces of the upper electrode. The sensor units 503 may be integrated into or associated with the electrode of the objective lens 501 furthest from the sample 208. This is in contrast to the detector module 402 of FIGS. 11 and 12, which is integrated into, or associated with, the lower electrode of an objective lens array. FIG. 16 depicts a two electrode objective lens, but it will be appreciated that any other form of objective lens, e.g. a three electrode lens, may also be used.

The electron detection device 240 in this example is placed away from the electrode of the objective lens array furthest from the source (i.e. away from a downbeam electrode of the objective lens array). In the example shown, the electron detection device is integrated or associated with an upper electrode of the array of objective lenses 501. The substrate supporting the sensor units 503 during operation may be held at the same potential difference as the upper electrode. In this position, an electrode in the array of objective lenses 501 is closer to the sample than, or downbeam of, the electron detection device 240. Thus, the secondary electrons emitted by the sample 208 are accelerated, for example to many kV (perhaps about 28.5 kV). As a result the sensor units 503 can comprise, for example, PIN detectors or scintillators. This has the advantage that no significant additional noise sources are present as PIN detectors and scintillators have a large initial amplification of the signal. Another advantage of this arrangement is that it is easier to access the electron detection device 240, e.g. for making power and signal connections or for servicing in use. Sensor units having capture electrodes could be used at this location instead, but this could result in poorer performance.

A PIN detector comprises a reverse-biased PIN diode and has an intrinsic (very lightly doped) semiconductor region sandwiched between a p-doped and an n-doped region. Secondary electrons incident on the intrinsic semiconductor region generate electron-hole pairs and allow a current to flow, generating a detection signal.

A scintillator comprises a material that emits light when electrons are incident on it. A detection signal is generated by imaging the scintillator with a camera or other imaging device.

In order to correctly image secondary electrodes on the sensor units 503 it is desirable to provide a relatively large potential difference between a last electrode of the objective lens array and the sample 208. For example, the upper electrode of the objective lens array may be at about 30 kV, the lower electrode at about 3.5 kV and the sample 208 at about 2.5 kV. A large potential difference between the lower electrode and the sample 208 may increase aberrations of the objective lens on the primary beam but a suitable trade-off can be selected.

Exact dimensions may be determined on a case-by-case basis. The diameter of the beam apertures 504 may be in the range of about 5 to 20 μm, e.g. about 10 μm. The width of the slits in the electrodes may be in the range of from 50 to 200 μm, e.g. about 100 μm. The pitch of the beam apertures and the electrode slits may be in the range of from 100 to 200 μm, e.g. about 150 μm. The gap between upper and lower electrodes may be in the range of from about 1 and 1.5 mm, e.g. about 1.2 mm. The depth of the lower electrode may be in the range of from about 0.3 to 0.6 mm, e.g. about 0.48 mm. The working distance between the lower electrode and the sample 208 may be in the range of form about 0.2 to 0.5 mm, e.g. about 0.37 mm. Desirably the electric field strength between the lower electrode and the sample 208 is no more than about 2.7 kV/mm in order to avoid or reduce damage to the sample 208. The field in the gap between upper and lower electrodes can be larger, e.g. over 20 kV/mm.

The beam apertures 504 associated with the sensor units have smaller diameters than apertures in the objective lens array to increase the surface of the sensor units available to capture electrons emanating from the sample. However, the beam aperture diameters are selected so that they permit passage of the sub-beams; that is the beam apertures 504 are not beam limiting. The beam apertures 504 are designed to permit passage of the sub-beams without shaping their cross-section. The same principle applies to the beam apertures 406 associated with the sensor units 402 of the example described above with reference to FIGS. 11 and 12.

In some embodiments, a single sensor unit (e.g. PIN detector) surrounds each aperture. In some embodiments, a plurality of sensor elements (e.g. smaller PIN detectors) is provided around each aperture. The signal generated from electrons captured by sensor elements surrounding one aperture may be combined into a single signal or used to generate independent signals. The sensor elements may be divided radially (i.e. to form a plurality of concentric annuluses), angularly (i.e. to form a plurality of sector-like pieces), both radially and angularly or in any other convenient manner.

Embodiments of the disclosure may be provided in the form of methods, which may use any of the arrangements described above, or other arrangements.

In some embodiments, an inspection method is provided. The inspection method may, for example, detect defects, classify defects and/or perform metrology tasks. In some applications, the inspection method may be referred to as a metro-inspection method. The inspection method may be implemented using any or all of the components of the charged particle assessment tools discussed above, including using any of the charged-particle multi-beam columns and/or multi-beam column arrays to project multi-beams towards a sample and detecting charged particles emitted from the sample. The inspection method may comprise using a multi-beam column array to project plural charged-particle multi-beams towards a sample. The method may further comprise applying a group focus correction to each of a plurality of groups of sub-beams of the multi-beams, each group focus correction being the same for all of the sub-beams of the respective group. The applying of the group focus correction may comprise applying different corrections to sub-beams from different multi-beams. Alternatively or additionally, the applying of the group focus correction may comprise applying different corrections to different sub-beams within the same multi-beam. The group correction may be applied mechanically and/or electrostatically.

Any of the charged-particle tools discussed herein may be an assessment tool. An assessment tool according to some embodiments of the disclosure may be a tool which makes a qualitative assessment of a sample (e.g. pass/fail), one which makes a quantitative measurement (e.g. the size of a feature) of a sample or which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools).

The terms “sub-beam” and “beamlet” are used interchangeably herein and are both understood to encompass any radiation beam derived from a parent radiation beam by dividing or splitting the parent radiation beam. The term “manipulator” is used to encompass any element which affects the path of a sub-beam or beamlet, such as a lens or deflector.

References to elements being aligned along a beam path or sub-beam path are understood to mean that the respective elements are positioned along the beam path or sub-beam path.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims and clauses.

Clause 1: A charged-particle multi-beam column for a charged-particle tool for projecting a charged-particle multi-beam towards a sample, the charged-particle multi-beam column comprising: a sub-beam defining aperture array configured to form sub-beams from a beam of charged particles emitted by a source; a collimator array down-beam from the sub-beam defining aperture array, each collimator being configured to collimate a sub-beam; an objective lens array, each objective lens being configured to project a collimated sub-beam onto a sample; and a detector configured to detect charged particles emitted from the sample, wherein each collimator is adjacent to, if not directly adjacent to, one of the objective lenses; and the detector is provided in a plane down-beam from the sub-beam defining aperture array.

Clause 2: The multi-beam column of clause 1, configured so that no lens array or deflector array is present up-beam of the collimator array.

Clause 3: The multi-beam column of clause 1 or 2, configured so that the collimator array is the first electron-optical array element in the beam path down-beam of an illumination system, preferably the source, configured to emit the charged particle beam.

Clause 4: The multi-beam column of any preceding clause, further comprising a down-beam aperture array in which is defined a plurality of apertures down-beam of the objective lens array, each of the apertures being aligned with a corresponding objective lens in the objective lens array and configured to allow only a selected portion of the collimated sub-beam incident onto the down-beam aperture array from the objective lens to pass through the aperture.

Clause 5: The multi-beam column of any of clauses 1-3, further comprising a down-beam aperture array in which is defined a plurality of apertures, each aperture being provided along a sub-beam path, wherein the down-beam aperture array: is down-beam of the objective lens array; and has apertures of smaller cross-sectional area than the apertures of the sub-beam defining aperture array.

Clause 6: The multi-beam column of any preceding clause, wherein: each objective lens in the objective lens array comprises a first electrode and a second electrode that is between the first electrode and the sample; and the multi-beam column is configured to apply first and second potentials to the first and second electrodes respectively, the first and second potentials being such that a sub-beam passing through the objective lens is decelerated to be incident on the sample with a desired landing energy.

Clause 7: The multi-beam column of any preceding clause, further comprising one or more aberration correctors configured to reduce one or more aberrations in the sub-beams.

Clause 8: The multi-beam column of clause 7, wherein each of at least a subset of the aberration correctors is integrated with, or directly adjacent to, one or more of the objective lenses in the objective lens array or one or more of the collimators in the collimator array.

Clause 9: The multi-beam column of clause 7 or 8, wherein the aberration correctors are configured to apply one or more of the following to the sub-beams: focus correction, field curvature correction, astigmatism correction.

Clause 10: A charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array being aligned with a corresponding objective lens in the objective lens array and configured to allow only a selected portion of the sub-beam incident onto the down-beam aperture array from the objective lens to pass through the aperture.

Clause 11: A charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array having a corresponding objective lens in the objective lens array, wherein the apertures of the down-beam aperture array are of smaller cross-sectional area than the corresponding apertures defined in the sub-beam defining aperture array and/or the objective lens array.

Clause 12: A charged-particle multi-beam column for a charged particle tool for projecting a charged-particle multi-beam towards a sample, the charged-particle multi-beam column comprising: an objective lens array, each objective lens being configured to project a sub-beam onto a sample; and a sub-beam defining aperture array adjacent and/or integrated into the objective lens array, the apertures of the sub-beam defining array and apertures of the objective lens array being along corresponding paths of the sub-beams wherein: the sub-beam defining aperture array is configured to allow only a selected portion of the sub-beam incident on each aperture of the sub-beam defining array through said aperture; and/or wherein: the apertures of the sub-beam defining aperture array are of smaller cross-sectional area than the corresponding apertures defined in the objective lens array.

Clause 13: The multi-beam column of any of clauses 10-12, further comprising a collimator array down-beam from the sub-beam defining aperture array, the collimators being configured to collimate each sub-beam between the sub-beam defining aperture array and the objective lens array.

Clause 14: The multi-beam column of any of clauses 10-13, further comprising a detector configured to detect charged particles emitted from the sample.

Clause 15: The multi-beam column of any of clauses 1-9 and 14, wherein the detector is provided in a plane down-beam from the sub-beam defining aperture array.

Clause 16: The multi-beam column of clause 15, wherein the detector is located in a down-beam-most surface of the multi-beam column.

Clause 17: The multi-beam column of clause 15, wherein the detector is located in a plane up-beam from at least one electrode of the objective lens array.

Clause 18: A charged-particle multi-beam column for a charged particle tool for projecting a charged-particle multi-beam towards a sample, the charged-particle multi-beam column comprising: a sub-beam defining aperture array configured to form sub-beams from a beam of charged particles emitted by a source; an objective lens array, each objective lens being configured to project a sub-beam onto a sample, the sub-beam defining aperture array being adjacent the objective lens array along paths of the sub-beams; and a detector configured to detect charged particles emitted from the sample, wherein the detector is provided in a plane down-beam from the sub-beam defining aperture array and up-beam from the objective lens array.

Clause 19: The multi-beam column of clause 17 or 18, wherein the detector is located in a down-beam surface of the sub-beam defining aperture array.

Clause 20: A charged-particle multi-beam column array, comprising: a plurality of the multi-beam columns of any preceding clause, wherein: each multi-beam column is configured to form the sub-beams from a beam of charged particles emitted by a different respective source of a plurality of sources; and the multi-beam columns are arranged to project the sub-beams simultaneously onto different regions of the same sample.

Clause 21: The multi-beam column array of clause 20, comprising the plurality of sources.

Clause 22: The multi-beam column array of clause 21, wherein at least a subset of the plurality of sources are provided as a source array, the source array comprising a plurality of sources provided on a common substrate.

Clause 23: A charged-particle multi-beam column array for a charged-particle tool for projecting a plurality of charged-particle multi-beams towards a sample, the charged-particle multi-beam column array comprising: a plurality of charged-particle multi-beam columns configured to project respective multi-beams simultaneously onto different regions of the sample; and a focus corrector configured to apply a group focus correction to each of a plurality of groups of sub-beams of the multi-beams, each group focus correction being the same for all of the sub-beams of the respective group.

Clause 24: The multi-beam column array of clause 23, wherein the focus corrector is configured to apply different corrections to sub-beams from different multi-beams.

Clause 25: The multi-beam column array of clause 23 or 24, wherein the focus corrector is configured to apply different corrections to different sub-beams within the same multi-beam.

Clause 26: The multi-beam column array of any of clauses 23-25, wherein the focus corrector is configured to apply each of one or more of the group focus corrections at least partly by mechanical actuation of a focus adjusting element.

Clause 27: The multi-beam column array of any of clauses 23-26, wherein the focus corrector is configured to apply each of one or more of the group focus corrections at least partly by changing an electrical potential applied to each of one or more electrodes.

Clause 28: The multi-beam column array of clause 27, wherein each multi-beam column comprises: a sub-beam defining aperture array configured to form sub-beams from a beam of charged particles emitted by a source associated with the multi-beam column; and an objective lens array, each objective lens being configured to project a sub-beam onto a sample, the focus corrector comprises a corrector aperture array in which is defined a plurality of groups of corrector apertures; and the corrector aperture array is integrated with, and/or directly adjacent to, one or more of the objective lens arrays.

Clause 29: The multi-beam column of clause 28, wherein the sub-beam defining aperture array is adjacent the objective lens array along paths of the sub-beams.

Clause 30: The multi-beam column array of clause 28 or 29, wherein the corrector aperture array comprises an electrode system comprising a plurality of electrodes, each electrode being electrically isolated from each other electrode and electrically connected simultaneously to aperture perimeter surfaces of all apertures in a different one of the groups of corrector apertures.

Clause 31: The multi-beam column array of any of clauses 28-30, wherein the corrector aperture array comprises an electrode system comprising a plurality of electrodes, each electrode being configured to apply a common electrical potential to aperture perimeter surfaces of all apertures in a different one of the groups of corrector apertures.

Clause 32: The multi-beam column array of any of clauses 28-31, wherein each corrector aperture is aligned along a sub-beam path with a respective objective lens.

Clause 33: The multi-beam column array of clause 32, wherein in each of one or more of the groups of corrector apertures, the objective lenses with which the corrector apertures are aligned are all in the same multi-beam column.

Clause 34: The multi-beam column array of clause 32 or 33, wherein in each of one or more of the groups of corrector apertures, at least a subset of the objective lenses with which the corrector apertures are aligned are in different multi-beam columns.

Clause 35: The multi-beam column array of any of clauses 20-34, wherein each multi-beam column further comprises a collimator array down-beam from the sub-beam defining aperture array, each collimator being configured to collimate a sub-beam.

Clause 36: The multi-beam column array of any of clauses 20-35, further comprising a detector configured to detect charged particles emitted from the sample.

Clause 37: The multi-beam column array of any of clauses 20-36, wherein the number of multi-beam columns is in the range of from 9 to 200.

Clause 38: An inspection method, comprising using the multi-beam column of any of clauses 1-19 to project a charged-particle multi-beam towards a sample and detecting charged particles emitted from the sample.

Clause 39: An inspection method, comprising using the multi-beam column array of any of clauses 20-37 to project plural charged-particle multi-beams towards a sample and detecting charged particles emitted from the sample.

Clause 40: An inspection method, comprising: using a multi-beam column array to project plural charged-particle multi-beams towards a sample; and applying a group focus correction to each of a plurality of groups of sub-beams of the multi-beams, each group focus correction being the same for all of the sub-beams of the respective group.

Clause 41: The method of clause 40, wherein the applying of the group focus correction comprises applying different corrections to sub-beams from different multi-beams.

Clause 42: The method of clause 40 or 41, wherein the applying of the group focus correction comprises applying different corrections to different sub-beams within the same multi-beam.

Clause 43: The method of any of clauses 40-42, wherein the group focus correction is applied mechanically and/or electrostatically.

The descriptions above are intended to be illustrative, not limiting. Thus, it will be apparent to one skilled in the art that modifications may be made as described without departing from the scope of the claims set out below.

The invention claimed is:

1. A charged-particle multi-beam column for a charged-particle tool for projecting a charged-particle multi-beam towards a sample, the charged-particle multi-beam column comprising:

a sub-beam defining aperture array configured to form sub-beams from a beam of charged particles emitted by a source;

a collimator array down-beam from the sub-beam defining aperture array, each collimator being configured to collimate a sub-beam;

an objective lens array, each objective lens being configured to project a collimated sub-beam onto a sample; and a detector configured to detect charged particles emitted from the sample wherein each collimator is directly adjacent to one of the objective lenses; and the detector is provided in a plane down-beam from the sub-beam defining aperture array.

2. The multi-beam column of claim 1, wherein the detector is located in a down-beam-most surface of the multi-beam column.

3. The multi-beam column of claim 1, wherein the detector is located in a plane up-beam from at least one electrode of the objective lens array.

4. The multi-beam column of claim 1, configured so that no lens array or deflector array is present up-beam of the collimator array.

5. The multi-beam column of claim 1, wherein the collimator array is integrated into the sub-beam defining aperture array.

6. The multi-beam column of claim 1, configured so that the collimator array is the first electron-optical array element in the beam path down-beam of the source.

7. The multi-beam column of claim 1, further comprising a down-beam aperture array in which is defined a plurality of apertures down-beam of the objective lens array, each of the apertures being aligned with a corresponding objective lens in the objective lens array and configured to allow only a selected portion of the collimated sub-beam incident onto the down-beam aperture array from the objective lens to pass through the aperture.

8. The multi-beam column of claim 1, further comprising a down-beam aperture array in which is defined a plurality of apertures, each aperture being provided along a sub-beam path, wherein the down-beam aperture array:

is down-beam of the objective lens array; and has apertures of smaller cross-sectional area than the apertures of the sub-beam defining aperture array.

9. The multi-beam column of claim 1, wherein:

each objective lens in the objective lens array comprises a first electrode and a second electrode that is between the first electrode and the sample; and the multi-beam column is configured to apply first and second potentials to the first and second electrodes respectively, the first and second potentials being such that a sub-beam passing through the objective lens is decelerated to be incident on the sample with a desired landing energy.

10. The multi-beam column of claim 1, further comprising one or more aberration correctors configured to reduce one or more aberrations in the sub-beams.

11. The multi-beam column of claim 10, wherein each of at least a subset of the aberration correctors is integrated with, or directly adjacent to, one or more of the objective lenses in the objective lens array or one or more of the collimators in the collimator array.

12. The multi-beam column of claim 10, wherein the aberration correctors are configured to apply one or more of the following to the sub-beams: focus correction, field curvature correction, astigmatism correction.

13. A charged-particle multi-beam column array, comprising:

a plurality of the multi-beam columns of claim 1, wherein:

each multi-beam column is configured to form the sub-beams from a beam of charged particles emitted by a different respective source of a plurality of sources; and the multi-beam columns are arranged to project the sub-beams simultaneously onto different regions of the same sample.

14. The multi-beam column array of claim 13, comprising the plurality of sources, wherein at least a subset of the plurality of sources are provided as a source array, the source array comprising a plurality of sources provided on a common substrate.

15. The multi-beam column array of claim 13, wherein the detector comprises electrodes configured to receive back-scattered or secondary electrons and to generate a detection signal.

16. The multi-beam column of claim 1, wherein each collimator and the corresponding directly adjacent objective lens are positioned closer to the sample than to the source.

17. A charged-particle multi-beam column for a charged particle tool for projecting a charged-particle multi-beam towards a sample, the charged-particle multi-beam column comprising:

a sub-beam defining aperture array configured to form sub-beams from a beam of charged particles emitted by a source;

an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array being aligned with a corresponding objective lens in the objective lens array and configured to allow only a selected portion of the sub-beam incident onto the down-beam aperture array from the objective lens to pass through the aperture.

18. A charged-particle multi-beam column for a charged particle tool for projecting a charged-particle multi-beam towards a sample, the charged-particle multi-beam column comprising:

a sub-beam defining aperture array configured to form sub-beams from a beam of charged particles emitted by a source;

an objective lens array, each objective lens being configured to project a sub-beam onto a sample, the sub-beam defining aperture array being adjacent the objective lens array along paths of the sub-beams; and a down-beam aperture array down-beam of the objective lens array, each of the apertures of the down-beam aperture array having a corresponding objective lens in the objective lens array, wherein the apertures of the down-beam aperture array are of smaller cross-sectional area than the corresponding apertures defined in the sub-beam defining aperture array and/or the objective lens array.

19. The multi-beam column of claim 18, further comprising a collimator array down-beam from the sub-beam defining aperture array, the collimators being configured to collimate each sub-beam between the sub-beam defining aperture array and the objective lens array.

20. The multi-beam column of claim 18, further comprising a detector configured to detect charged particles emitted from the sample.

21. The multi-beam column of claim 20, wherein the detector is provided in a plane down-beam from the sub-beam defining aperture array.

* * * * *